United States Patent
Shibuta

(10) Patent No.: US 8,368,870 B2
(45) Date of Patent: Feb. 5, 2013

(54) EXPOSURE APPARATUS AND DEVICE MANUFACTURING METHOD

(75) Inventor: Makoto Shibuta, Kumagaya (JP)

(73) Assignee: Nikon Corporation, Tokyo (JP)

( * ) Notice: Subject to any disclaimer, the term of this patent is extended or adjusted under 35 U.S.C. 154(b) by 1053 days.

(21) Appl. No.: 11/629,987

(22) PCT Filed: Jun. 21, 2005

(86) PCT No.: PCT/JP2005/011375
§ 371 (c)(1),
(2), (4) Date: Dec. 19, 2006

(87) PCT Pub. No.: WO2005/124835
PCT Pub. Date: Dec. 29, 2005

(65) Prior Publication Data
US 2008/0043210 A1    Feb. 21, 2008

(30) Foreign Application Priority Data
Jun. 21, 2004    (JP) .................. 2004-182678

(51) Int. Cl.
G03B 27/58    (2006.01)
G03B 27/52    (2006.01)
(52) U.S. Cl. .......................................... 355/72; 355/30
(58) Field of Classification Search .................... 355/30, 355/53, 72
See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 5,528,118 A | 6/1996 | Lee | |
| 5,610,683 A | 3/1997 | Takahashi | |
| 5,623,853 A | 4/1997 | Novak et al. | |
| 5,715,039 A | 2/1998 | Fukuda et al. | |
| 5,825,043 A | 10/1998 | Suwa | |
| 5,874,820 A | 2/1999 | Lee | |
| 2002/0124798 A1 | 9/2002 | Kitano et al. | |
| 2004/0160582 A1 | 8/2004 | Lof et al. | |
| 2004/0165159 A1 | 8/2004 | Lof et al. | |

(Continued)

FOREIGN PATENT DOCUMENTS

DE    221 563    4/1985
DE    224 448    7/1985

(Continued)

OTHER PUBLICATIONS

English Translation of JP 10-303114 (dated Nov. 13, 1998).*

(Continued)

*Primary Examiner* — Peter B Kim

(57) ABSTRACT

An exposure apparatus that can prevent disadvantages due to a leaked liquid is provided. The exposure apparatus includes: a substrate holder (PH) that includes a peripheral wall portion (33) and supporting portions (34) located on an inside of the peripheral wall portion (33) and that supports a substrate (P) with the supporting portions (34) by negatively pressurizing a space (31) surrounded by the peripheral wall portion (33); and a recovery mechanism that includes a collection inlets (61) provided on the inside of the peripheral wall portion (33) and a vacuum system (63) connected to the collection inlets (61), in which a liquid penetrated from an outer periphery of the substrate (P) is sucked and recovered, in the state with an upper surface (33A) of the peripheral wall portion (33) and a back surface (Pb) of the substrate (P) being spaced at a first distance.

45 Claims, 10 Drawing Sheets

U.S. PATENT DOCUMENTS

| | | | |
|---|---|---|---|
| 2005/0128463 A1* | 6/2005 | Ottens et al. | 355/75 |
| 2005/0219488 A1 | 10/2005 | Nei et al. | |
| 2006/0077367 A1 | 4/2006 | Kobayashi et al. | |
| 2006/0119813 A1* | 6/2006 | Hultermans et al. | 355/53 |
| 2006/0139614 A1 | 6/2006 | Owa et al. | |

FOREIGN PATENT DOCUMENTS

| | | |
|---|---|---|
| EP | 0 605 103 A1 | 7/1994 |
| EP | 1 429 188 A2 | 6/2004 |
| EP | 1 699 073 | 9/2006 |
| JP | 57-117238 | 7/1982 |
| JP | 58-202448 | 11/1983 |
| JP | 59-19912 | 2/1984 |
| JP | 62-65326 | 3/1987 |
| JP | 63-157419 | 6/1988 |
| JP | 4-65603 | 3/1992 |
| JP | 4-305915 | 10/1992 |
| JP | 4-305917 | 10/1992 |
| JP | 5-62877 | 3/1993 |
| JP | 6-53120 | 2/1994 |
| JP | 6-124873 | 5/1994 |
| JP | 6-168866 | 6/1994 |
| JP | 6-188169 | 7/1994 |
| JP | 7-176468 | 7/1995 |
| JP | 7-220990 | 8/1995 |
| JP | 8-37149 | 2/1996 |
| JP | 8-166475 | 6/1996 |
| JP | 8-316125 | 11/1996 |
| JP | 8-330224 | 12/1996 |
| JP | 10-163099 | 6/1998 |
| JP | 10-214783 | 8/1998 |
| JP | 10-303114 | 11/1998 |
| JP | 10-340846 | 12/1998 |
| JP | 11-16816 | 1/1999 |
| JP | 11-176727 | 7/1999 |
| JP | 2000-58436 | 2/2000 |
| JP | 2000-505958 | 5/2000 |
| JP | 2000-243684 | 9/2000 |
| JP | 2001-176781 | 6/2001 |
| JP | 2002-14005 | 1/2002 |
| JP | 2004-289127 | 10/2004 |
| WO | WO 98/28665 | 7/1998 |
| WO | WO 99/49504 | 9/1999 |
| WO | WO 2004/105107 | 2/2004 |
| WO | WO 2004/019128 | 3/2004 |
| WO | WO 2004/053953 | 6/2004 |
| WO | WO 2004/093160 | 10/2004 |
| WO | WO 2004/112108 | 12/2004 |
| WO | WO 2005/010611 | 2/2005 |
| WO | WO 2005/057636 | 6/2005 |

OTHER PUBLICATIONS

Office Action mailed from the Japanese Patent Office on May 24, 2011 in the related Japanese patent application No. 2006-514839.
Office Action mailed from the Korean Intellectual Property Office on May 30, 2011 in the related Korean patent application No. 10-2006-7023349.
English language translation of JP 8-316125.
English language translation of JP 8-37149.
English language translation of JP 7-176468.
English language translation of JP 57-117238.
English language translation of JP 2002-14005.
English language translation of JP 11-16816.
English language translation of JP 6-188169.
English language translation of JP 6-53120.
English language translation of JP 10-163099.
English language translation of JP 10-214783.
English language translation of JP 8-166475.
English language translation of JP 8-330224.
English language translation of JP 6-168866.
English language translation of JP 10-303114.
English language translation of JP 2000-243684.
English language translation of WO 2004/053953.
English language translation of WO 2004/105107.
English language translation of WO 2005/057636.
English language translation of JP 4-65603.
International Search Report issued in counterpart PCT patent application No. PCT/2005/011375 on Oct. 4, 2005.
Written Opinion issued in counterpart PCT patent application No. PCT/2005/011375 on Oct. 4, 2005.

* cited by examiner

EXPOSURE APPARATUS AND DEVICE MANUFACTURING METHOD

TECHNICAL FIELD

The present invention relates to an exposure apparatus that exposes a substrate via a liquid and to a device manufacturing method.

Priority is claimed on Japanese Patent Application No. 2004-182678, filed on Jun. 21, 2004, the content of which is incorporated herein by reference.

BACKGROUND ART

Semiconductor devices and liquid crystal display devices are manufactured through the so-called photolithography technique, by which a pattern formed on a mask is transferred onto a photosensitive substrate. The exposure apparatus used in the photolithography process has a mask stage that supports a mask and a substrate stage that supports a substrate via a substrate holder, and while successively moving the mask stage and the substrate stage, transfers the mask pattern, via a projection optical system, onto the substrate. In recent years, there has been demand for higher resolution projection optical systems in order to handle the much higher levels of integration of device patterns. As the exposure wavelength to be used is shorter, the resolution of the projection optical system becomes higher. As the numerical aperture of the projection optical system is larger, the resolution of the projection optical system becomes higher. Consequently, the exposure wavelength used in exposure apparatuses has shortened year by year, and the numerical aperture of projection optical systems has also increased. Furthermore, the current mainstream exposure wavelength is 248 nm of KrF excimer laser, but an even shorter wavelength of 193 nm of ArF excimer laser is now gradually being put to practical use. Furthermore, as well as resolution, the depth of focus (DOF) is also important when performing an exposure. The resolution R and the depth of focus 6 are respectively expressed by the following formulas:

$$R = k_1 \cdot \lambda / NA, \quad (1)$$

$$\delta = \pm k_2 \cdot \lambda / NA^2, \quad (2)$$

where $\lambda$ is the exposure wavelength, NA is the numerical aperture of the projection optical system, and $k_1$ and $k_2$ are process coefficients. It can be seen from formulas (1) and (2) that if, to enhance the resolution R, the wavelength $\lambda$ is made shorter and the numerical aperture NA is made larger, then the depth of focus $\delta$ becomes narrower.

When the depth of focus $\delta$ becomes too narrow, it becomes difficult to make the substrate surface coincide with the image plane of the projection optical system, and thus there is the possibility that the focus margin during the exposure operation will be insufficient. To address this problem, the liquid immersion method, which is disclosed in, e.g., Patent Document 1 below, has been proposed as a method to make the exposure wavelength substantially shorter and to make the depth of focus substantially broader. This liquid immersion method is designed, by filling the space between the under surface of the projection optical system and the substrate surface with a liquid, e.g., water or organic solvent, to form a liquid immersion region and thus by taking advantage of the fact that the wavelength of the exposure light in the liquid becomes 1/n times (n is the refractive index of the liquid and is generally about 1.2 to 1.6) of that in the air, improve the resolution and, at the same time, enlarge the depth of focus by approximately n times.

Patent Document 1: PCT International Publication No. WO 99/49504

By the way, in an exposure apparatus utilizing the liquid immersion method, if the liquid flows from the upper surface of the substrate to the side of the back surface of the substrate and penetrates or inflows into the space between the substrate and the substrate holder that holds the substrate, there is a possibility that the substrate holder cannot hold the substrate sufficiently, leading to a disadvantage such as the deterioration of exposure accuracy. For example, when the liquid penetrated into the space between the back surface of the substrate and the substrate holder adheres to the back surface of the substrate or the upper surface of the substrate holder and then vaporizes, there is a possibility that an adhesion trace (so-called water mark) is formed on the back surface of the substrate or upper surface of the substrate holder. A water mark behaves as a foreign matter. Therefore, there occurs a disadvantage that a flatness (the degree of flatness) when the substrate is held by the substrate holder deteriorates, and thus good exposure accuracy cannot be maintained.

DISCLOSURE OF INVENTION

The present invention has been achieved in view of such circumstances, and has an object to provide an exposure apparatus that can prevent the occurrence of disadvantages due to leaked liquid, and to provide a device manufacturing method using the exposure apparatus.

To solve the above-described problems, the present invention adopts the following configurations.

An exposure apparatus of the present invention is an exposure apparatus that exposes a substrate by irradiating exposure light onto a front surface of the substrate via a projection optical system and a liquid, including: a substrate holder that holds a back surface of the substrate; and a recovery mechanism that recovers substantially simultaneously the liquid that is adhered to the back surface of the substrate and the liquid that is adhered to the substrate holder.

According to the present invention, since the recovery mechanism substantially simultaneously recovers the liquid that is adhered to the back surface of the substrate and the liquid that is adhered to the substrate holder, the liquid can be recovered quickly in a short time. Therefore, occurrence of disadvantages due to the liquid that is adhered to the back surface of the substrate or to the substrate holder can be prevented, and good exposure accuracy can be maintained. Furthermore, since the recovery mechanism recovers the liquid quickly in a short time, the adhered liquid can be recovered before the liquid vaporizes. Therefore, formation of an adhesion trace (water mark) on the back surface of the substrate or on the substrate holder can be prevented. Furthermore, since the liquid can be recovered in a short time, the time required for the liquid recovery process can be shortened and thus availability of the exposure apparatus can be improved as well.

Furthermore, an exposure apparatus of the present invention is an exposure apparatus that exposes a substrate by irradiating exposure light onto a front surface of the substrate via a projection optical system and a liquid, including: a substrate holder that includes a peripheral wall portion and a supporting portion located on an inside of the peripheral wall portion and that supports the substrate with the supporting portion by negatively pressurizing a space surrounded by the peripheral wall portion; and a recovery mechanism that has a collection port provided on the inside of the peripheral wall portion and a vacuum system connected to the collection port, in which a liquid penetrated from an outer periphery of the substrate is sucked and recovered, with an upper surface of the peripheral wall portion and a back surface of the substrate being spaced at a first distance.

Furthermore, an exposure apparatus of the present invention is an exposure apparatus that exposes a substrate by irradiating exposure light onto a front surface of the substrate held on the substrate holder via a projection optical system and a liquid, including a recovery mechanism that includes: a collection port; a vacuum system; and a channel that connects the collection port and the vacuum system, and that recovers the liquid via the collection port, in which a heat-insulating material is provided on an inner wall surface of the channel. According to the present invention, with a heat-insulating layer being made of the heat-insulating material provided on the channel inner wall, even if a liquid remaining in the channel vaporizes, the influence of the heat of vaporization on the surroundings (e.g., on the substrate holder) (such as heat deformation) can be suppressed.

According to the present invention, by driving the recovery mechanism, in the state with the upper surface of the peripheral wall portion of the substrate holder and the back surface of the substrate being spaced at a first distance, to negatively pressurize the space surrounded by the peripheral wall portion via the collection port provided on the inside thereof, a flow of gas is generated between the inside and outside of the space, and the liquid that is adhered to the back surface of the substrate and the liquid that is adhered to the substrate holder can be recovered substantially simultaneously by using the flow of gas. Therefore, the liquid can be recovered quickly in a short time, occurrence of disadvantages due to the liquid that is adhered to the back surface of the substrate or to the substrate holder can be prevented, and good exposure accuracy can be maintained. Furthermore, since the recovery mechanism recovers the liquid quickly in a short time, the adhered liquid can be recovered before the liquid vaporizes. Therefore, formation of an adhesion trace (water mark) on the back surface of the substrate or on the substrate holder can be prevented. Furthermore, since the liquid can be recovered in a short time, the time required for a liquid recovery treatment can be shortened and thus availability of the exposure apparatus can be improved as well.

Furthermore, an exposure apparatus (EX) of the present invention is an exposure apparatus that exposes a substrate (P) by irradiating exposure light onto a front surface of the substrate (P) held on the substrate holder (PH) via a projection optical system (PL) and a liquid (LQ), including a recovery mechanism (60) that includes: a collection port (61); a vacuum system (63); and a channel (62) that connects the collection port and the vacuum system, and that recovers the liquid (LQ) via the collection port, in which a heat-insulating material (120) is provided on an inner wall surface of the channel. According to the present invention, with a heat-insulating layer being made of the heat-insulating material provided on the channel inner wall, even if a liquid remaining in the channel vaporizes, the influence of the heat of vaporization on the surroundings (e.g., on the substrate holder) (such as heat deformation) can be suppressed.

Furthermore, an exposure apparatus of the present invention is an exposure apparatus that exposes a substrate by irradiating exposure light onto a front surface of the substrate held on the substrate holder via a projection optical system and a liquid, including a recovery mechanism that includes: a collection port; a vacuum system; and a channel that connects the collection port and the vacuum system, and that recovers the liquid via the collection port, in which at least a part of the channel is located in an inside of the substrate holder and in which a liquid-repellent material is provided on an inner wall surface of the channel. According to the present invention, by making the channel wall surface liquid-repellent, the liquid can be prevented from remaining in the channel.

Furthermore, an exposure apparatus of the present invention is an exposure apparatus that exposes a substrate by irradiating exposure light onto a front surface of the substrate held on the substrate holder via a projection optical system and a liquid, including a recovery mechanism that includes: a collection port; a vacuum system; and a channel that connects the collection port and the vacuum system, and that recovers the liquid via the collection port, in which a liquid-repellent material and a heat-insulating material are provided on an inner wall surface of the channel. According to the present invention, by making the channel wall surface liquid-repellent, the liquid can be prevented from remaining in the channel; and besides, by providing a heat-insulating layer made of the heat-insulating material on an inner wall of the channel, even if liquid remaining in the channel vaporizes, the influence of the heat of vaporization on the surroundings (e.g., on the substrate holder) (such as heat deformation) can be suppressed.

Furthermore, an exposure apparatus of the present invention is an exposure apparatus that exposes a substrate by irradiating exposure light onto a front surface of the substrate held on the substrate holder via a projection optical system and a liquid, including a recovery mechanism that has a collection port; a vacuum system; and a channel that connects the collection port and the vacuum system, and that recovers the liquid via the collection port, in which at least a part of the channel is located in an inside of the substrate holder and in which a fluorine-based resin material is provided on an inner wall surface of the channel. According to the present invention, with the fluorine-based resin material being provided on an inner wall of the channel, both of a liquid-repellent function and a heat-insulating function can be obtained.

A device manufacturing method of the present invention includes using the above-described exposure apparatus. According to the present invention, a device can be disposed that exposes the substrate with good accuracy and that has a desired performance.

According to the present invention, occurrence of disadvantages due to the leaked liquid can be prevented, and good exposure accuracy can be maintained.

BEST MODE FOR CARRYING OUT THE INVENTION

Figure 1:
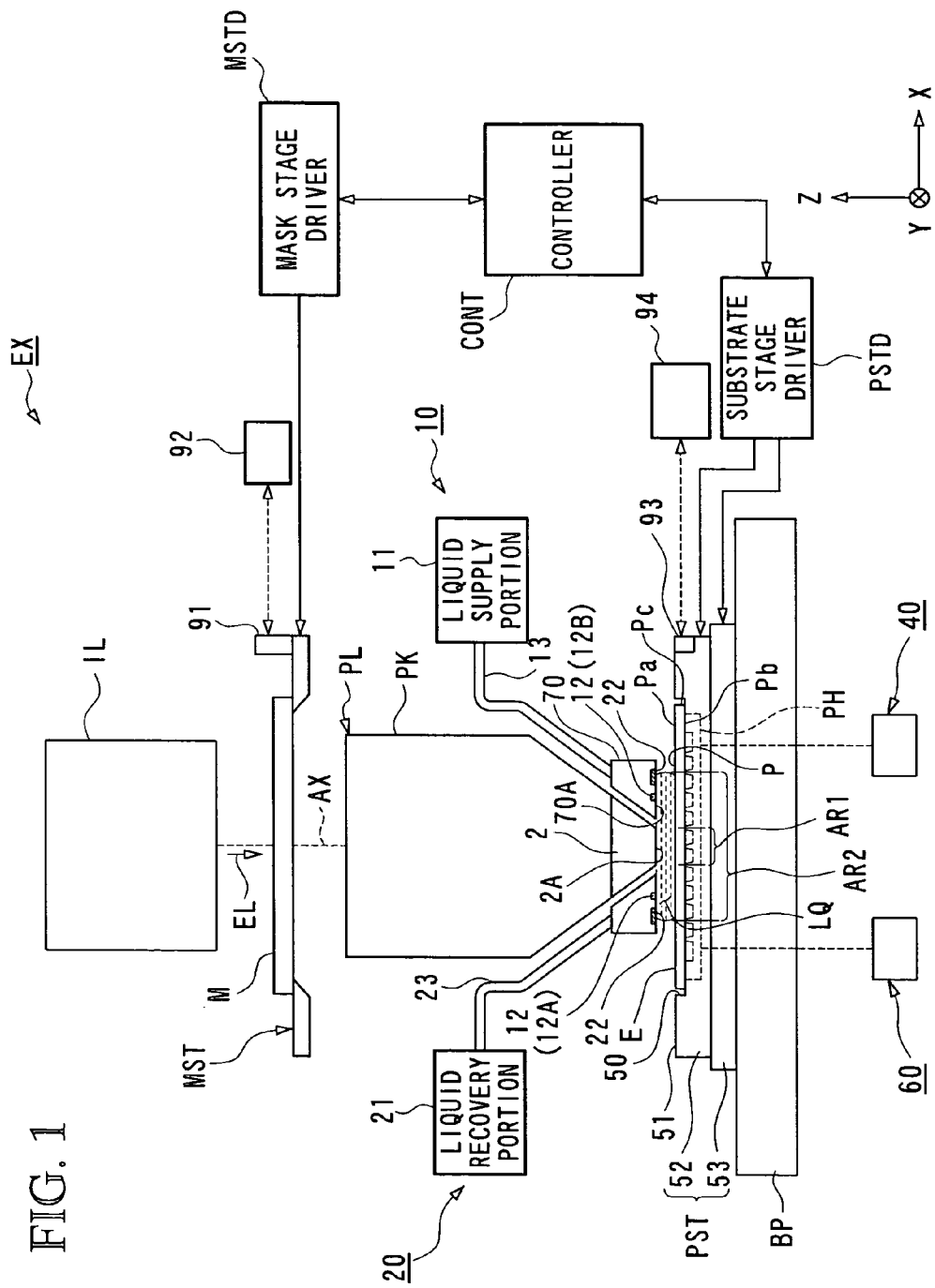
FIG. 1 is a schematic block diagram of an exposure apparatus showing an embodiment of the present invention.

Hereunder is a description of embodiments of the present invention with reference to the drawings. FIG. 1 is a schematic block diagram showing an embodiment of an exposure apparatus of the present invention.

In FIG. 1, the exposure apparatus EX includes: a mask stage MST that is movable while supporting a mask M; a substrate stage PST that has a substrate holder PH for holding a back surface Pb of a substrate P and that is movable in the state with the substrate P being held by the substrate holder PH; an illumination optical system IL that illuminates the mask M supported by the mask stage MST with an exposure light EL; a projection optical system PL that projection-exposes a pattern image of the mask M illuminated with the exposure light EL onto a front surface Pa of the substrate P supported by the substrate stage PST; and a controller CONT that controls the overall operation of the exposure apparatus EX. Note that the term "substrate" referred to herein encompasses a semiconductor wafer over which a photoresist, a photosensitive material, is applied. In this embodiment, a photoresist is disposed on the front surface Pa of the substrate P, and the front surface Pa serves as a surface to be exposed onto which the exposure light is radiated. Furthermore, the term "mask" encompasses a reticle on which a device pattern to be reduction projected onto a substrate is formed.

The exposure apparatus EX of this embodiment is a liquid immersion exposure apparatus, which adopts a liquid immersion method, with the exposure wavelength being substantially shortened, to improve the resolution and to substantially widen the depth of focus. The exposure apparatus EX includes a liquid supply mechanism 10 that supplies the liquid LQ onto the substrate P and a first liquid recovery mechanism 20 that recovers the liquid LQ on the substrate P. The exposure apparatus EX, at least while transferring the pattern image of the mask M onto the front surface Pa of the substrate P, uses the liquid LQ supplied from the liquid supply mechanism 10 to form a liquid immersion region AR2 locally on at least a part of the substrate P including the projection region AR1 of the projection optical system PL such that the liquid immersion region A2 is larger than the projection region AR1 and smaller than the substrate P. More specifically, the exposure apparatus EX fills the space between an optical element 2 located at the image plane side end portion of the projection optical system PL and the front surface Pa of substrate P with the liquid LQ, and projects, via the liquid LQ between the projection optical system PL and the substrate P as well as the projection optical system PL, a pattern image of the mask M onto the substrate P held on the substrate holder PH, thus exposing the substrate P.

Furthermore, the exposure apparatus EX includes a second liquid recovery mechanism 60 that is capable of sucking and recovering the liquid LQ having leaked from an outer periphery of the substrate P. The second liquid recovery mechanism 60 can substantially simultaneously recover the liquid that is adhered to the back surface Pb of the substrate P and the liquid that is adhered to the substrate holder PH. Furthermore, the second liquid recovery mechanism 60 can also substantially simultaneously recover the liquid that is adhered to a side surface Pc of the substrate P.

The present embodiment will now be described assuming, as an example, the case where as the exposure apparatus EX, a scan type exposure apparatus (the so-called scanning stepper) is used in which while synchronously moving the mask M and the substrate P in mutually different directions (opposite directions) along the scanning directions, the pattern formed on the mask M is exposed onto the substrate P. In the following description, it is assumed that the direction that coincides with an optical axis AX of the projection optical system PL is referred to as the Z-axis direction, that the synchronous movement direction (the scanning direction), in a plane perpendicular to the Z-axis direction, of the mask M and the substrate P is referred to as the X-axis direction, and that the direction perpendicular to the Z-axis and Y-axis directions is referred to as the Y-direction (the non-scanning direction). Furthermore, the rotation (inclination) directions around the X-axis, Y-axis and Z-axis are the θX, θY and θZ directions, respectively.

The illumination optical system IL is for illuminating the mask M supported by the mask stage MST with the exposure light EL and has an exposure light source that emits the exposure light EL, an optical integrator for making the illuminance of the exposure light EL emitted from the exposure light source uniform, a condenser lens for condensing the exposure light EL from the optical integrator, a relay lens system, a variable field stop for making an illumination area on the mask M formed by the exposure light EL a slit-like shape, or the like. A specified illumination area on the mask M is illuminated by the illumination optical system IL with the exposure light EL having a uniform illuminance distribution. For the exposure light EL radiated from the illumination optical system IL, for example, emission lines of the ultraviolet region (g-line, h-line, i-line), radiated, for example, from a mercury lamp, deep ultraviolet beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm), may be used. In this embodiment, an ArF excimer laser light is used. As described above, the liquid LQ in this embodiment is pure or purified water, which can transmit an ArF excimer laser light even if it is used as the exposure light EL. Furthermore, pure water can also transmit emission lines of the ultraviolet region (g-line, h-line, or i-line) and a deep ultraviolet light (DUV light) such as a KrF excimer laser light (wavelength: 248 nm).

The mask stage MST is movable while holding the mask M and fixes the mask M by, for example, vacuum attraction (or electrostatic attraction). The mask stage MST is two-dimensionally movable in a plane perpendicular to the optical axis AX of the projection optical system PL, i.e., in the XY-plane, and is finely rotatable in the θZ direction. The mask stage MST is driven by a mask stage driver MSTD such as a linear motor. The mask stage driver MSTD is controlled by the controller CONT.

A movement mirror 91 is provided on the mask stage MST. Furthermore, a laser interferometer 92 is provided at a position facing the movement mirror 91. The movement mirror 91 is a mirror for the laser interferometer 92 for measuring the position of the mask stage MST. The two-dimensional (X and Y directions) position and the rotation angle in the θZ direction (including rotation angles in the θX and θY directions, as the case may be) of the mask M on the mask stage MST are measured by the laser interferometer 92 in real time. The measurement results from the laser interferometer 92 are output to the controller CONT. By driving the mask stage driver MSTD based on the measurement results from the laser interferometer 92, the controller CONT controls the position of the mask M supported by the mask stage MST.

The projection optical system PL is for projection-exposing the pattern of the mask M onto the substrate P at a predetermined projection magnification of β. The projection optical system PL is constituted by a plurality of optical elements, including an optical element 2 provided at the end portion on the substrate P side, and those optical elements are supported by a lens barrel PK. In this embodiment, the projection optical system PL is a reduction system of which projection magnification β is, for example, ¼, ⅕, or ⅛. The projection optical system PL may also be either a 1× magnification system or a magnifying system. Furthermore, the optical element 2 at the end portion of the projection optical system PL of this embodiment is detachably (exchangeably) provided on the lens barrel PK, and the liquid LQ of the liquid immersion region AR2 comes into contact with the optical element 2.

The substrate stage PST is movable while holding the substrate holder PH that holds the substrate P, and besides, is two-dimensionally movable in the XY-plane, and is finely rotatable in the θZ direction. Moreover, the substrate stage PST is movable also in the Z-axis, θX, and θY directions. The substrate holder PH is for holding the substrate P, and is provided on the substrate stage PST (Z tilt stage 52). The substrate holder PH holds the substrate by vacuum attraction. The substrate stage PST includes: a Z tilt stage 52 that supports the substrate holder PH; and an XY stage 53 that supports the Z tilt stage 52, and the XY stage 53 is supported on a base BP. The Z tilt stage 52 can move the substrate P held on the substrate holder PH in the Z-axis direction and in the θX and θY directions (tilting directions). The XY stage 53 can move the substrate P held on the substrate holder PH in the two-dimensional directions (X and Y directions) and in the θZ direction via the Z tilt stage 52. Obviously, the Z tilt stage and the XY stage may be integrally provided.

On the Z tilt stage 52 (substrate stage PST), a concave or recess portion 50 is provided, and the substrate holder PH is located in the concave portion 50. Furthermore, the upper surface 51 of the Z tilt stage 52 other than the concave portion 50 is a flat surface such that it is substantially as high as (flush with) the front surface Pa of the substrate P held on the substrate holder PH. The upper surface 51 substantially flush with the surface of the substrate P is provided around the substrate P. Therefore, even when the edge portion E of the substrate P is liquid-immersion-exposed, the liquid immersion region AR2 can be well formed in the state with the liquid LQ being held on the image plane side of the projection optical system PL.

The substrate stage PST having the Z tilt stage 52 and the XY stage 53 is driven by a substrate stage driver PSTD having a linear motor, and the like. The substrate stage driver PSTD is controlled by the controller CONT. With the Z tilt stage 52 being driven, the substrate holder PH moves, and the substrate P held on the substrate holder PH is controlled in the position at the Z-axis direction (focus position) and in the inclination-direction position. Furthermore, with the XY stage 53 being driven, the substrate holder PH moves, and the substrate P is controlled in the position at the XY direction and in the position at the θZ direction.

A movement mirror 93 is provided on the Z tilt stage 52 (substrate stage PST). Furthermore, a laser interferometer 94 is provided at a position facing the movement mirror 93. The movement mirror 93 is a mirror for the laser interferometer 94 for measuring a position of the Z tilt stage 52 (substrate holder PH). In this embodiment, the upper surface of the movement mirror 93 is formed also so as to be substantially flush with the front surface Pa of the substrate P held on the substrate holder PH. It is formed such that, when the substrate P is held via the substrate holder PH, substantially the entire region of the upper surface of the substrate stage PST including the front surface Pa of the substrate P held and the upper surface of the movement mirror 93 becomes a flat surface (full flat surface). The two-dimensional direction position and the rotation angle in the θZ direction of the substrate holder PH are measured by the laser interferometer 94 in real time. With the position of the Z tilt stage 52 being measured with the laser interferometer 94, the two-dimensional position and the rotation angle in the θZ direction of the substrate P held via the substrate holder PH are measured. Furthermore, although not shown in the figure, the exposure apparatus EX includes a focus leveling detection system, as disclosed in, for example, Japanese Unexamined Patent Publication, First Publication No. H08-37149, that detects the position information of the front surface Pa of the substrate P held on the substrate holder. The focus leveling detection system detects position information of the surface of the substrate P in the Z-axis direction and inclination information of the substrate P in the θX and θY directions.

The measurement results from the laser interferometer 94 are output to the controller CONT. The measurement results from the focus leveling detection system are also output to the controller CONT. The controller CONT drives the substrate stage driver PSTD based on the detection results from the focus leveling detection system, and controls the focus position and inclination angle of the substrate P to make the front surface Pa of the substrate P coincide with the image plane of the projection optical system PL in an auto-focus manner and an auto-leveling manner. Furthermore, the controller CONT drives the XY stage 53, via the substrate stage driver PSTD, within a two-dimensional coordinate system defined by the laser interferometer 94, and thereby controls the positions of the substrate P held on the substrate holder PH in the X-axis and Y-axis directions.

The liquid supply mechanism 10 is for supplying the predetermined liquid LQ to the image plane side of the projection optical system PL, and includes: a liquid supply portion 11 that can deliver the liquid LQ; and a supply pipe 13 one end of which is connected to the liquid supply portion 11. The liquid supply portion 11 includes a tank that stores the liquid LQ, a pressurizing pump, a filter unit that removes foreign matter and bubbles contained in the liquid LQ, and the like. The liquid supply operation of the liquid supply portion 11 is controlled by the controller CONT. When the liquid immersion region AR2 is formed on the substrate P, the liquid supply mechanism 10 supplies the liquid LQ to the substrate P.

The first liquid recovery mechanism 20 is for recovering the liquid LQ on the image plane side of the projection optical system PL, and includes: a liquid recovery portion 21 that can recover the liquid LQ; and a recovery pipe 23 one end of which is connected to the liquid recovery portion 21. The liquid recovery portion 21 includes, for example, a vacuum system (suction apparatus) such as a vacuum pump, a gas-liquid separator that separates the gas from the recovered liquid LQ, a tank that stores the recovered liquid LQ, and the like. As the vacuum system, a vacuum system in a plant where the exposure apparatus is to be installed may be used instead of providing a vacuum pump in the exposure apparatus EX. The liquid recovery operation of the liquid recovery portion 21 is controlled by the controller CONT. To form the liquid immersion region AR2 on the substrate P, the first liquid recovery mechanism 20 recovers a predetermined amount of the liquid LQ on the substrate P supplied from the liquid supply mechanism 10.

A nozzle member 70 is located in the vicinity of the optical element 2, among a plurality of optical elements that constitute the projection optical system PL, that comes into contact with the liquid LQ. The nozzle member 70 is an annular member that is provided so as to surround, above the substrate P (substrate holder PH), a side surface of the optical element 2. A gap is provided between the nozzle member 70 and the optical element 2, and the nozzle member 70 is supported by a predetermined support system so as to be vibrationally separated from the optical element 2. Furthermore, it is configured such that the liquid LQ does not penetrate into the gap and that a bubble does not mix into the liquid LQ from the gap. The nozzle member 70 can be formed of, e.g., stainless steel.

The nozzle member 70 includes a supply port 12 that is provided above the substrate P (substrate holder PH) and that is located so as to face the surface of the substrate P. In this embodiment, the nozzle member 70 has two supply ports 12A, 12B. The supply ports 12A, 12B are provided in an under surface 70A of the nozzle member 70.

Inside the nozzle member 70 is formed a supply channel through which the liquid LQ to be supplied onto the substrate P flows. One end of the supply channel of the nozzle member 70 is connected to the other end of the supply pipe 13, and the other end of the supply channel is connected to each of the supply ports 12A, 12B. Here, the other end of the supply channel formed inside the nozzle member 70 is branched from an intermediate position to be connectable to each of a plurality of (two) supply ports 12A, 12B.

Furthermore, the nozzle member 70 includes a collection port 22 that is provided above the substrate P (substrate stage PST) and that is located so as to face the surface of the substrate P. In this embodiment, the collection port 22 is formed in the under surface 70A of the nozzle member 70 in an annular shape so as to surround the optical element 2 (projection region AR1) of the projection optical system PL and the supply ports 12.

Furthermore, inside the nozzle member 70 is formed a recovery channel through which the liquid LQ recovered via the collection port 22 flows. One end of the recovery channel of the nozzle member 70 is connected to the other end of the recovery pipe 23, and the other end of the recovery channel is connected to the collection port 22. Here, the recovery channel formed inside the nozzle member 70 includes an annular channel in accordance with the collection port 22 and a manifold channel that gathers the liquid LQ having flowed through the annular channel.

In this embodiment, the nozzle member 70 constitutes a respective part of the liquid supply mechanism 10 and the first liquid recovery mechanism 20. The supply ports 12A, 12B that constitute the liquid supply mechanism 10 are respectively provided on both sides of the X axis direction of the projection region AR1 with the projection region AR1 being interposed therebetween, and the collection port 22 that constitutes the first liquid recovery mechanism 20 is provided outside the liquid supply ports 12A, 12B of the liquid supply mechanism 10 with respect to the projection region AR1 of the projection optical system PL. The projection region AR1 of the projection optical system PL in this embodiment is provided in a rectangular shape in a planar view with the Y-axis direction as the longitudinal direction and with the X-axis direction as the latitudinal direction.

The operation of the liquid supply portion 11 is controlled by the controller CONT. The controller CONT can control the per-unit-time liquid supply amount by the liquid supply portion 11. When supplying the liquid LQ onto the substrate P, the controller CONT delivers the liquid LQ from the liquid supply portion 11 to supply, via the supply pipe 13 and the supply channel formed inside the nozzle member 70, the liquid LQ onto the substrate P from the supply ports 12A, 12B provided above the substrate P. The liquid LQ is supplied from both sides of the projection region AR1 via the supply ports 12A, 12B.

The operation of the liquid recovery portion 21 is controlled by the controller CONT. The controller CONT can control the per-unit-time liquid recovery amount by the liquid recovery portion 21. The liquid LQ on the substrate P having been recovered from the collection port 22 provided above the substrate P is recovered into the liquid recovery portion 21 via the recovery channel formed inside the nozzle member 70 and the recovery pipe 23.

Figure 2:
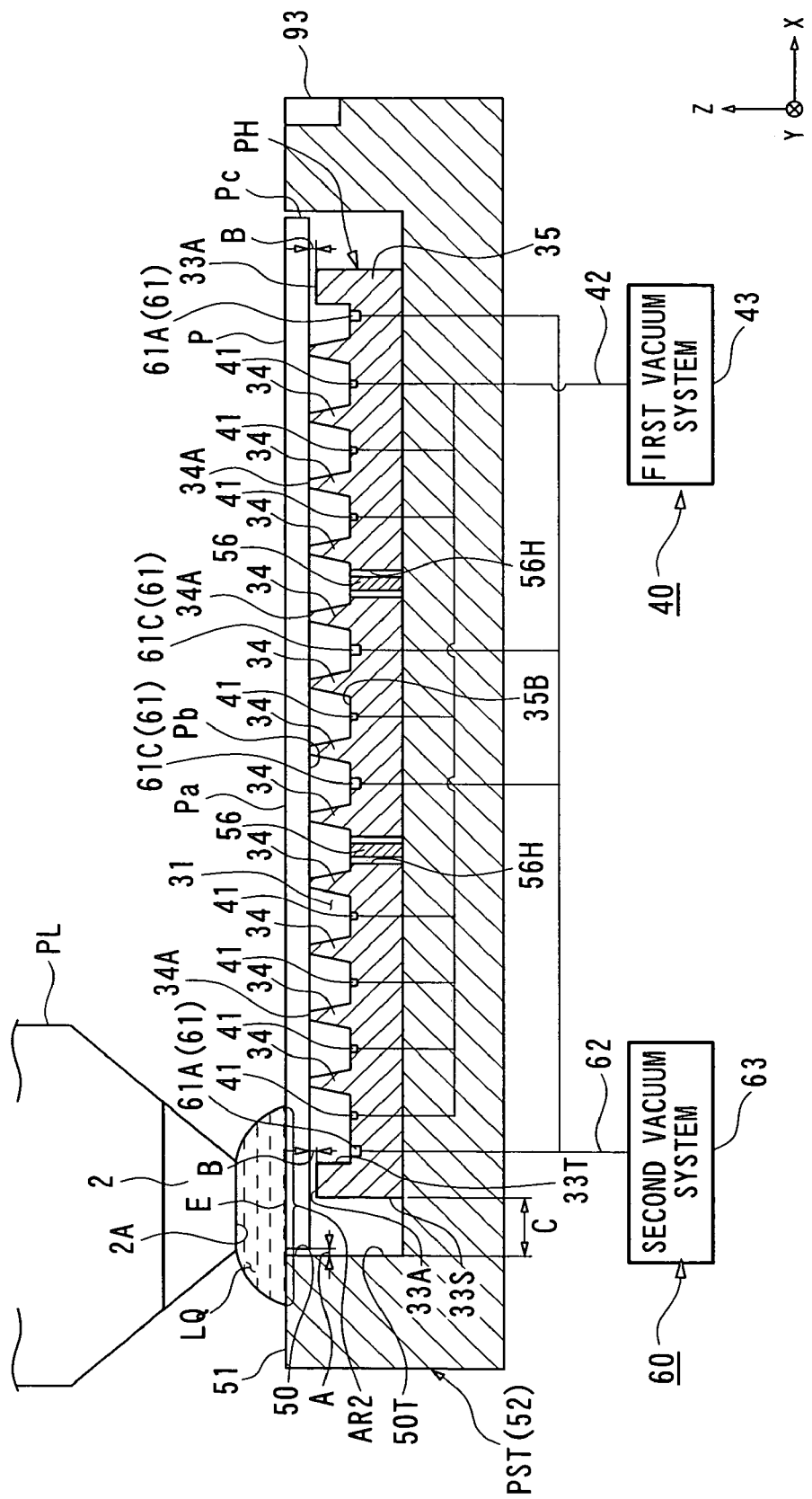
FIG. 2 is a side sectional view of the vicinity of a substrate holder.

An embodiment of the substrate holder PH that holds the substrate P will now be described with reference to FIG. 2, FIG. 3, and FIG. 4. FIG. 2 is a side sectional view of the substrate holder PH holding the substrate P, FIG. 3 is a plan view of the substrate holder PH, seen from above, and FIG. 4 is a plan view of the substrate holder PH holding the substrate P, seen from above.

Figure 3:
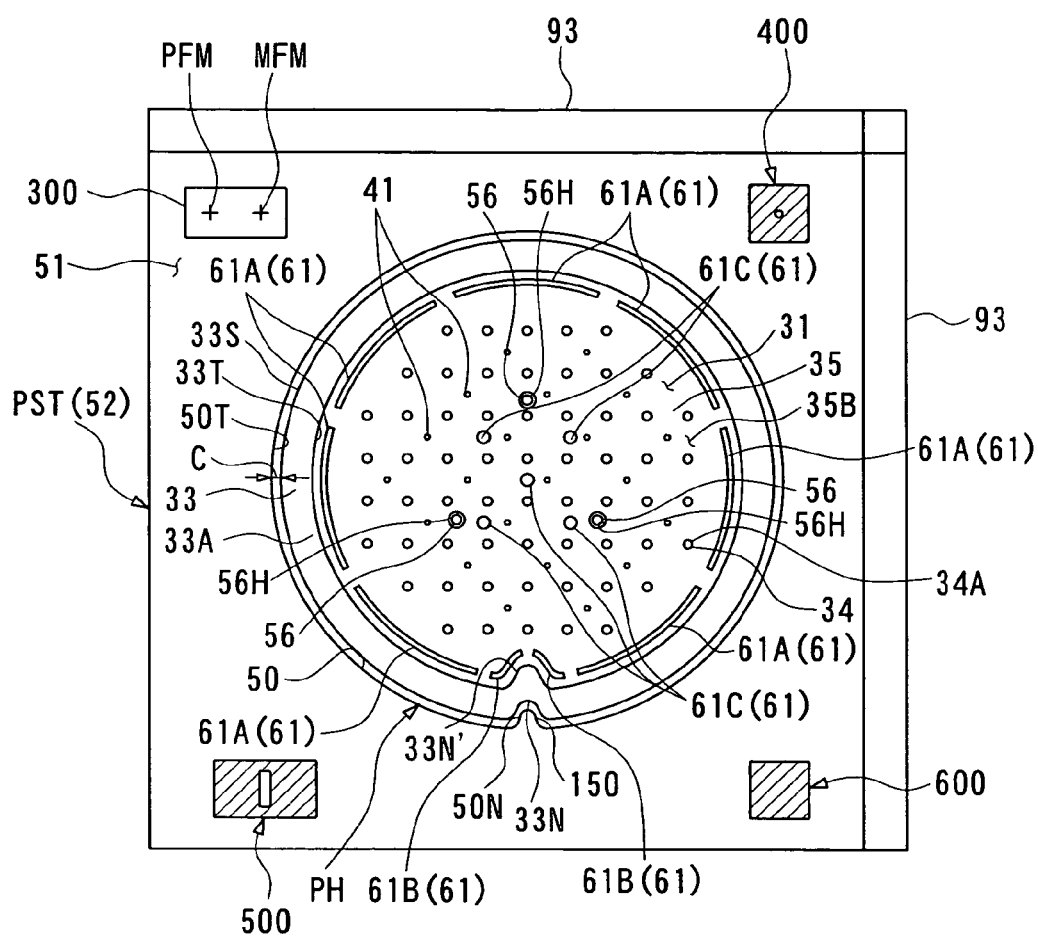
FIG. 3 is a plan view of the vicinity of the substrate holder.
Figure 4:
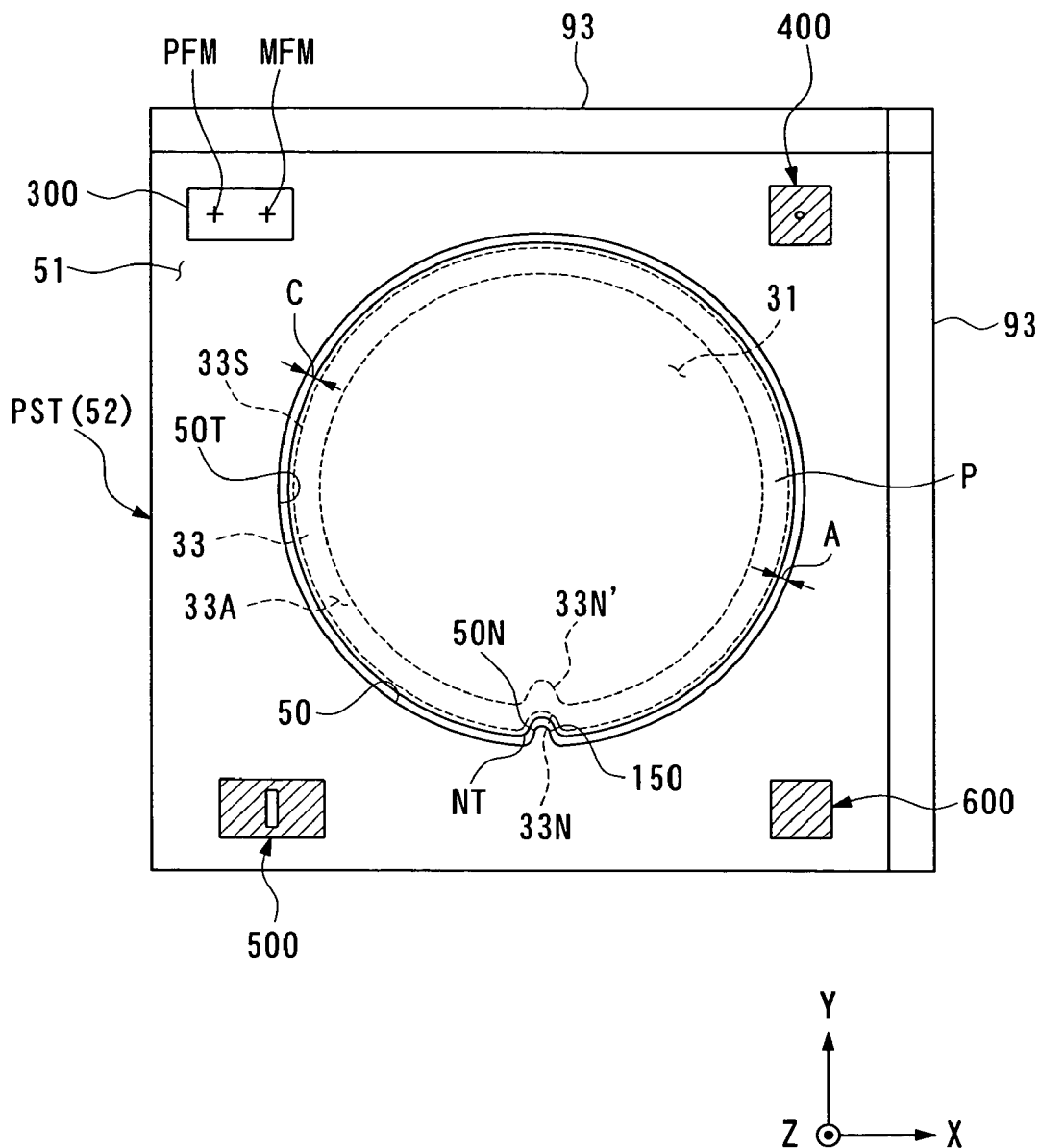
FIG. 4 is a plan view of the vicinity of the substrate holder, with a substrate held on the substrate holder.

In FIG. 2 and FIG. 3, the substrate holder PH includes: a base member 35 that has a bottom surface 35B facing, at a predetermined distance apart, the back surface Pb of the substrate P; a peripheral wall portion 33 that is formed on the base member 35 and that has an upper surface 33A facing the back surface Pb of the substrate P; and a plurality of supporting portions 34 formed on the bottom surface 35B on the inside of the peripheral wall portion 33. The peripheral wall portion 33 is formed in a substantially annular shape in accordance with the shape of the substrate P. An upper surface 33A of the peripheral wall portion 33 is formed so as to face an edge area of the back surface Pb of the substrate P. Furthermore, the upper surface 33A of the peripheral wall portion 33 is a flat surface. In the figures, the upper surface 33A of the peripheral wall portion 33 has a relatively wide width. In practice, however, it has a width of about 1 to 2 mm.

The supporting portions 34 of the substrate holder PH are provided uniformly on the inside of the peripheral wall portion 33. In this embodiment, the supporting portions 34 of the substrate holder PH are constituted by including a plurality of supporting pins, and thus the substrate holder PH constitutes a so-called pin chuck structure. The pin chuck structure of the substrate holder PH includes a suction mechanism 40 that negatively pressurizes the space 31 surrounded by the base member 35 of the substrate holder PH, the peripheral wall portion 33 of the substrate holder PH, and the substrate P, and supports the substrate P with the supporting portions 34 by providing negative pressure in the space 31. The back surface Pb of the substrate P supported by the supporting portions 34 faces the bottom surface 35B at a predetermined distance apart from each other.

The suction mechanism 40 of the substrate holder PH includes: a plurality of suction ports 41 provided on the inside of the peripheral wall portion 33; and a first vacuum system 43 that is connected to each of the suction ports 41 via a channel 42. The suction ports 41 are provided at a plurality of predetermined positions, respectively, in the bottom surface 35B on the inside of the peripheral wall portion 33 excluding the supporting portions 34, and are located uniformly on the inside of the peripheral wall portion 33.

The first vacuum system 43 is for negatively pressurizing the space 31 surrounded by the base member 35, the peripheral wall portion 33, and the substrate P, and is constituted by including a vacuum pump. The controller CONT drives the first vacuum system 43 and suctions a gas (air) in the space 31 surrounded by the base member 35, the peripheral wall portion 33, and the substrate P to negatively pressurize the space 31, and thus the substrate P is attracted and held on the supporting portions 34 of the substrate holder PH.

Between an inner surface 50T formed by the concave portion 50 of the Z tilt stage 52 (substrate stage PST) and an outer surface 33S of the peripheral wall portion 33 is provided a gap (clearance) C having a predetermined distance. Furthermore, between an edge portion on the outside of the substrate P held on the substrate holder PH and the upper surface 51 (inner surface 50T) of the Z tilt stage 52 (substrate stage PST) provided around the substrate P is formed a gap A having a distance of about 0.1 to 1.0 mm. In this embodiment, the gap A is about 0.3 mm. The outer diameter of the peripheral wall portion 33 is formed smaller than the outer diameter of the substrate P, and the gap C is larger than the gap A, for example, about 1.5 mm.

Furthermore, as shown in FIG. 4, in the substrate P of this embodiment, a notch portion NT is formed, which is a cut portion for aligning. The shape of the upper surface 51 is formed in accordance with the outer shape of the substrate P (the shape of the notch portion NT) such that the distance of the gap, at the notch portion NT, between the substrate P and the upper surface 51 of the Z tilt stage 52 is set to about 0.1 to 1.0 mm. That is, between the entire region of the edge portion of the substrate P including the notch portion NT and upper surface 51, the gap A with a distance of about 0.1 to 1.0 mm is secured. More specifically, on the upper surface 51 of the Z tilt stage 52, is provided a protrusion portion 150 that protrudes toward the inside of the concave portion 50 so as to correspond to the shape of the notch portion NT of the substrate P. On the inner surface 50T of the Z tilt stage, a convex portion 50N in accordance with the shape of the protrusion portion 150 is formed. The protrusion portion 150 has a function as a gap adjustment portion for making the gap between the front surface Pa, at the notch portion NT, of the substrate P held on the substrate holder PH and the upper surface 51 small. In this embodiment, the protrusion portion 150 is part of the upper surface 51 of the Z tilt stage 52 and thus is integrally formed. However, it may be configured such that the upper surface 51 of the Z tilt stage 52 and the protrusion portion 150 are separately provided and that the protrusion portion 150 is replaceable with respect to the upper surface 51 of the Z tilt stage 52.

On the outer surface 33S of the peripheral wall portion 33 and the upper surface thereof is formed a concave portion 33N in accordance with the shape of the protrusion portion 150 of the upper surface 51 and the shape of the notch portion NT of the substrate P. On an inner surface 33T of the peripheral wall portion 33 is formed a convex portion 33N' that protrudes toward the inside in accordance with the concave portion 33N (notch portion NT). The concave portion 33N of the peripheral wall portion 33 is provided at a position facing the convex portion 50N of the inner surface 50T, and a gap C of a predetermined distance is formed between the concave portion 33N and the convex portion 50N.

The description has been made referring to, as a cut portion of the substrate P, the notch portion NT by way of example. However, in the case where an orientation flat portion is formed as a cut portion on the substrate P, the upper surface 51, the inner surface 50T, and the peripheral wall portion 33 may each be formed in a shape in accordance with the outer shape of the substrate P (the shape of the orientation flat portion) to secure the gap A with a predetermined distance between the orientation flat portion of the substrate P and the upper surface 51 therearound.

The second liquid recovery mechanism 60 includes collection ports 61 (61A to 61C) provided on the inside of the peripheral wall portion 33 and a second vacuum system 63 connected to the collection ports 61 via a channel 62. The second liquid recovery mechanism 60 can recover the liquid LQ via the collection ports 61, and further includes a gas-liquid separator that separates a gas from the recovered liquid, a tank that stores the recovered liquid LQ, and the like.

The collection ports 61 are provided in a plurality of predetermined positions, respectively, in the bottom surface 35B on the inside of the peripheral wall portion 33 excluding the supporting portions 34. Each of the plurality of the collection ports 61 is connected to the second vacuum system 63 via the channel 62. The peripheral wall portion 33 is formed so as to surround the supporting portions 34, the suction ports 41, and the collection ports 61.

As shown in FIG. 3, the collection ports 61 include: first collection ports 61A and second collection ports 61B that are provided in the vicinity of the inside of the peripheral wall portion 33 so as to be along the inner surface 33T of the peripheral wall portion 33; and third collection ports 61C that are provided in a substantially central portion of the bottom surface 35B. Among the plurality of collection ports 61, the first collection ports 61A are located in the bottom surface 35B of the substrate holder PH in the vicinity of the inner surface 33T so as to be along the inner surface 33T of the peripheral wall portion 33. Each of the first collection ports 61A is formed in a substantially arc-like slit shape in a planar view, and is located so as to surround the space 31. Furthermore, the second collection ports 61B are provided, in the bottom surface 35B of the substrate holder PH, in the vicinity of the inside of the concave portion 33N (convex portion 33N') of the peripheral wall portion 33. Each of the second collection ports 61B is formed in a slit shape in a planar view in accordance with the shape of the convex portion 33N'. Furthermore, the third collection ports 61C are provided in a substantially central portion of the bottom surface 35B. Each of the third collection ports 61C is formed in a substantially circular shape from a planar view. The shapes and locations of the collection ports 61A to 61C shown in FIG. 3 are an example. The shapes and locations thereof can be set arbitrary. For example, the first collection ports 61 may be provided in succession or continuously along the inner surface 33T of the peripheral wall portion 33. Alternatively, each of the first collection ports 61A may be in a substantially circular shape in a planar view, and the circular shaped first collection ports 61A may be located along the inner surface 33T of the peripheral wall portion 33.

The second vacuum system 63 is for sucking and recovering the liquid LQ via the collection ports provided inside the space 31, and is constituted by including a vacuum pump. Furthermore, a gas-liquid separator that separates a gas from the recovered liquid LQ is provided on the upstream side of the second vacuum system 63 (on the collection ports 61 side). Furthermore, the first vacuum system 43 connected to the suction ports 41 for negatively pressurizing the space 31 and the second vacuum system 63 connected to the collection ports 61 for recovering the liquid LQ are configured independently of each other. The controller CONT can individually control the respective operations of the first vacuum system 43 and the second vacuum system 63, and can independently perform the suction operation of the first vacuum system 43 and the suction operation of the second vacuum system 63.

Furthermore, in this embodiment, the supporting portions 34 of the substrate holder PH are formed as high as or a slightly higher than the peripheral wall portion 33. That is, the position of the upper surfaces 34A of the supporting portions 34 in the Z-axis direction is formed as high as or slightly higher than the position of the upper surface 33A of the peripheral wall portion 33 in the Z-axis direction. With this configuration, when the substrate P is supported by the upper surfaces 34A of the supporting portions 34, a gap B with a predetermined distance D2 is formed between the upper surface 33A of the peripheral wall portion 33 and the back surface Pb of the substrate P by negatively pressurizing the space 31 surrounded by the peripheral wall portion 33. The distance D2 (gap B) is small. Therefore, the negative pressure in the space 31 is maintained. In the case where the upper surface 33A of the peripheral wall portion 33 is in contact with the back surface Pb of the substrate P, the distance D2 (gap B) is zero.

The position of the upper surfaces 34A of the supporting portions 34 in the Z-axis direction may be formed slightly lower than the position of the upper surface 33A of the peripheral wall portion 33 in the Z-axis direction. With this configuration, by negatively pressurizing the space 31 surrounded by the peripheral wall portion 33, the upper surface 33A of the peripheral wall portion 33 and the back surface Pb of the substrate P come into tight contact, making the distance D2 (gap B) zero. Due to the tight contact between the back surface Pb of the substrate P and the upper surface 33A of the peripheral wall portion 33, even if the liquid LQ inflows into the back surface Pb side of the substrate P, the penetration of the liquid LQ into the space 31 from between the back surface Pb of the substrate P and the upper surface 33A of the peripheral wall portion 33 can be prevented.

Furthermore, in this embodiment, the upper surface 33A of the peripheral wall portion 33 is a flat surface, and has liquid-repellency. In this embodiment, the upper surface 33A is provided with liquid-repellency by being subjected to a liquid-repellent treatment. Liquid-repellent treatments for making the upper surface 33A liquid-repellent include: the application of a fluorine-based resin material such as polytetrafluoroethylene or an acrylic resin material; or attachment of a thin film made of the aforementioned liquid-repellent material. The entirety of the substrate holder PH including the upper surface 33A may be formed of a liquid-repellent material (such as fluorine-based resin).

Moreover, in this embodiment, the outer surface 33S of the peripheral wall portion 33 of the substrate holder PH and the inner surface 50T of the Z tilt stage 52 also have a liquid-repellency by applying the aforementioned liquid-repellent treatment thereto. Furthermore, the upper surface 51 of the substrate stage PST (Z tilt stage 52) also has liquid-repellency by applying the aforementioned liquid-repellent treatment thereto. Furthermore, the surface of the base member 35 including the surfaces of the supporting portions 34 and the bottom surface 35B also have liquid-repellency by applying the aforementioned liquid-repellent treatment thereto.

Furthermore, the front surface Pa of the substrate P, which is the exposure surface, is applied or coated with a photoresist (photosensitive material). In this embodiment, the photosensitive material is a photosensitive material for an ArF excimer laser, and has liquid-repellency. Furthermore, in this embodiment, a side surface Pc of the substrate P is subjected to a liquid-repellent treatment (water-repellent treatment). More specifically, the side surface Pc of the substrate P, too, is applied with the aforementioned photosensitive material having a liquid-repellency. By this, the penetration of the liquid LQ from the gap A between the inner surface 50T of the Z tilt stage 52 and the side surface Pc of the substrate P can be more securely prevented. Moreover, the back surface Pb of the substrate P, too, is subjected to a liquid-repellent treatment with the application of the aforementioned photosensitive material. A material for making the back surface Pb and/or side surface Pc of the substrate P liquid-repellent is not limited to the aforementioned photosensitive material, but may be a predetermined liquid-repellent material. For example, there is a case where a protective layer (a film that protects photosensitive material from the liquid), called topcoat layer, is applied over the top layer of a photosensitive material that is applied over the front surface Pa of the substrate P, i.e., the exposure surface. When a topcoat layer forming material (e.g., fluororesin material) has liquid-repellency (water-repellency), the topcoat layer forming material may be applied to the side surface Pc and/or back surface Pb of the substrate P. Of course, a material having a liquid-repellency, other than the photosensitive material and the topcoat layer forming material, may be applied.

The under surface (liquid contact surface) 2A of the optical element 2 of the projection optical system PL and the under surface (liquid contact surface) 70A of the nozzle member 70 have lyophilicity (hydrophilicity). In this embodiment, the optical element 2 is formed of calcium fluorite, which has a high affinity for pure water. The liquid contact surface 2A of the optical element 2 is lyophilic or liquid-attractive. Therefore, the liquid LQ can be made to be in tight contact with substantially the entire surface of the liquid contact surface 2A of the optical element 2. Furthermore, in the embodiment, it is configured such that the liquid supply mechanism 10 supplies the liquid (water) LQ having a high affinity for the liquid contact surface 2A of the optical element 2. Therefore, the degree of contact between the liquid contact surface 2A of the optical element 2 and the liquid LQ can be increased, so that the optical path between the optical element 2 and the substrate P can be securely filled with the liquid LQ. The optical element 2 may be made of silica glass, which has a high affinity for water. Furthermore, it may be configured such that the liquid contact surface 2A of the optical element 2 and the liquid contact surface 70A of the nozzle member 70 are subjected to hydrophilic treatment (lyophilic treatment) to enhance the affinity for the liquid LQ. As a lyophilic treatment, treatment in which lyophilic materials such as $MgF_2$, $Al_2O_3$, and $SiO_2$ is provided on the aforementioned liquid contact surface can be listed. Alternatively, as lyophilic (hydrophilic) treatment, a thin film formed of a substance with a molecular structure having a large polarity, e.g., alcohol, may be provided since the liquid LQ of this embodiment is water having a large polarity.

As shown in FIG. 3 and FIG. 4, the Z tilt stage 52 (substrate stage PST) is formed in a substantially rectangular shape in a planar view, and on the two edge portions of the Z tilt stage 52, perpendicular to each other, are respectively formed movement mirrors 93 for the laser interferometer 94 for measuring the position of the Z tilt stage 52 (substrate holder PH). Furthermore, on the upper surface 51 of the Z tilt stage 52 is provided a fiducial member 300 for defining the position of the substrate P with respect to an image of the pattern of the mask M via the projection optical system PL. A fiducial mark PFM and a fiducial mark MFM are formed on the fiducial member 300 with a predetermined positional relationship. The fiducial mark PFM is detected by a substrate alignment system of a Field Image Alignment (FIA) method, as disclosed in Japanese Unexamined Patent Application, First Publication No. H04-65603, in which illumination light such as white light from a halogen lamp is radiated onto a mark with the substrate stage PST (substrate holder PH) in a stationary state, and the obtained image of the mark is then picked up in a predetermined image pickup vision field by an image pickup device to subject the image to image data processing, thus measuring the position of the mark. Furthermore, the fiducial mark MFM is detected, via the mask M and the projection optical system PL, by a mask alignment system of a visual reticle alignment (VRA) method, as disclosed in Japanese Unexamined Patent Application, First Publication No. H07-176468, in which light is radiated onto a mark, and image data of the mark picked up by a CCD camera, or the like is subjected to image data processing, thus detecting the mark position.

Furthermore, as optical sensors, for example, an illuminance non-uniformity sensor 400 as disclosed in Japanese Unexamined Patent Application, First Publication No. S57-117238, an aerial image measurement sensor 500 as disclosed in Japanese Unexamined Patent Application, First Publication No. 2002-14005, and an irradiated light amount sensor (illuminance sensor) 600 as disclosed in Japanese Unexamined Patent Application, First Publication No. H11-16816, etc. can be used on the upper surface 51. When the fiducial member 300 and optical sensors 400, 500, 600 are provided, the upper surface of the fiducial member 300 and the upper surfaces of the optical sensors 400, 500, 600 as well are made to be substantially flush with the upper surface 51 of the substrate stage PST and the front surface Pa of the substrate P. Furthermore, the upper surfaces of the fiducial member 300 and optical sensors 400, 500, 600 are subjected to a liquid-repellent treatment so as to be liquid-repellent.

As shown in FIG. 2, the substrate holder PH includes raising/lowering members 56 constituted by pin members that hold the back surface Pb of the substrate P and that raise and lower the substrate P with respect to the substrate holder PH. It is configured such that the base member 35 is provided with hole portions 56H for locating the raising/lowering members 56, and that the raising/lowering members 56 that raise and lower the substrate P are provided on the inside of the peripheral wall portion 33 (i.e., inside the space 31). In this embodiment, the raising/lowering members 56 are provided in three positions, respectively (refer to FIG. 3). The raising/lowering members 56 are adapted to be raised and lowered, while holding the back surface Pb of the substrate P, by a driving unit, not shown in the figure. The controller CONT controls the raising/lowering operation of the raising/lowering members 56 via the driving unit. Furthermore, the distance between the back surface Pb of the substrate P and the upper surface 33A of the peripheral wall portion 33 can be adjusted by the raising and lowering of the raising/lowering members 56 while holding the back surface Pb of the substrate P.

Next, a method of exposing the substrate P by using an exposure apparatus EX described above will be made with reference to the schematics shown in FIGS. 5A to 5D.

To carry in (load) the substrate P to be exposure-processed onto the substrate holder PH by using a transfer arm, the controller CONT raises the raising/lowering members 56. The transfer arm transfers the substrate P to the raising/lowering members 56 being raised. The raising/lowering members 56 are lowered while holding the substrate P transferred from the transfer arm. After the raising/lowering members 56 are lowered and the substrate P is mounted on the substrate holder PH, the controller CONT drives the first vacuum system 43 to negatively pressurize the space 31. By this, the substrate P is attracted and held by the substrate holder PH. At this time, the drive of the second vacuum system 63 is at rest.

As described above, by negatively pressurizing the space 31, the gap B with a distance D2 is formed between the upper surface 33A of the peripheral wall portion 33 and the back surface Pb of the substrate P when the substrate P is supported by the supporting portions 34.

After the substrate P is attracted and held by the substrate holder P, the controller CONT uses, prior to starting an exposure process of the substrate P, the aforementioned fiducial member 300, substrate alignment system, mask alignment system, etc. to determine the positional relationship (baseline amount), in the coordinate system defined by the laser interferometer 94, between the projection position of a pattern image of the mask M via the projection optical system PL and the detection fiducial or reference position of the substrate alignment system. Furthermore, prior to starting the exposure process of the substrate P, the controller CONT forms the liquid immersion region AR2 over the optical sensors 400, 500, 600, and measures the imaging characteristics of the projection optical system PL via the liquid LQ. Then, the controller CONT, based on the measurement results from the optical sensors 400, 500, 600, performs processes including an imaging characteristics adjustment (calibration) process of the projection optical system PL.

Figure 5A:
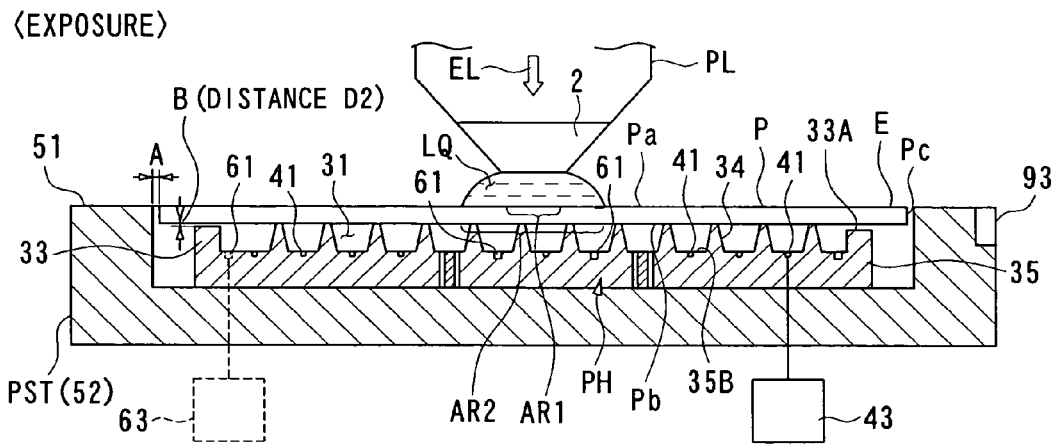
FIG. 5A is a schematic diagram illustrating an example of an exposure operation.

After completion of the measurement process, the controller CONT moves the substrate stage PST (XY stage 53) to move the liquid immersion region AR2 formed on the image plane side of the projection optical system PL onto the substrate P. By this, as shown in FIG. 5A, the liquid immersion region AR2 of the liquid LQ is formed between the projection optical system PL and the substrate P.

The exposure apparatus EX of this embodiment projection-exposes the pattern image of the mask M on the substrate P while moving the mask M and the substrate P in the X-axis direction (scanning direction). During scanning exposure, a pattern image of a part of the mask M is projected in the projection region AR1 via the liquid LQ of the liquid immersion region AR2 and the projection optical system PL, and in synchronization with the mask M moving in the −X direction (or the +X direction) at a velocity V, the substrate P moves in the +X direction (or the −X direction) at a velocity $\beta \cdot V$ (where $\beta$ is the projection magnification) with respect to the projection region AR1. A plurality of shot areas are set on the substrate P in a matrix manner. After completion of exposure of one shot area, the next shot area moves to the scan starting position through the stepping movement of the substrate P. In this way, the scanning exposure process of each shot area is successively performed, in a state where the substrate P is moved in accordance with a step-and-scan method.

When exposing each of the shot areas on the substrate P, the controller CONT uses the substrate alignment system to detect an alignment mark accompanyingly provided in individual shot areas. The position of the substrate stage PST, when the substrate alignment system is detecting an alignment mark on the substrate P, is measured by the laser interferometer 94. The controller CONT acquires the position information of the shot areas with respect to the detection fiducial position of the substrate alignment system based on the detection results of the alignment marks, and moves the substrate stage PST based on the acquired position information and a previously-measured baseline amount to align the projection position of the pattern image of the mask M and the shot areas thereof.

In this embodiment, liquid-immersion-exposure is performed also on the shot area provided in an edge area E of the substrate P. Forming a pattern also on the edge area E of the substrate P by means of an exposure process prevents, in a chemical mechanical polishing (CMP) process, which is a subsequent step, uneven contact of the substrate P against the polishing surface of a CMP system; or forming a small device pattern also on the edge area E enables effective utilization of the substrate P.

When the shot area provided in the edge area E of the substrate P is exposed, the liquid immersion region AR2 of the liquid LQ is formed over the gap A. The distance of the gap A is set to be about 0.1 to 1.0 mm. Furthermore, the front surface Pa of the substrate P and the upper surface 51 of the Z tilt stage 52 are liquid-repellent, and the side surface Pc of the substrate P and the inner surface 50T of the Z tilt stage 52 that form the gap A are liquid-repellent as well. Therefore, the surface tension of the liquid LQ suppresses the penetration of the liquid LQ of the liquid immersion region AR2 into the back surface Pb side of the substrate P through the gap. Moreover, in this embodiment, the gap A between the substrate P and the upper surface 51 is also secured at the notch portion (cut portion) NT of the substrate P. Therefore, the penetration of the liquid LQ from the vicinity of the notch portion NT is also prevented.

Furthermore, the upper surface 51 of the Z tilt stage 52 is also liquid-repellent. Therefore, the liquid LQ can be held or retained well under the projection optical system PL due to the upper surface 51 also when the edge area E of the substrate P is exposed. Thus, it is possible to prevent the liquid LQ from remaining on the upper surface 51, after the exposure. Furthermore, if the liquid LQ remains on the upper surface 51, the remaining liquid LQ can be smoothly recovered since the upper surface is liquid repellent.

Furthermore, the back surface Pb of the substrate P is liquid-repellent and the upper surface 33A of the peripheral wall portion 33 facing the back surface Pb is also liquid-repellent. Therefore, even if the liquid penetrate onto the back surface Pb side of the substrate P through the gap A, and even in the case where the gap B with a predetermined distance D2 is formed, the penetration of the liquid LQ into the space 31 through the gap B is prevented. Consequently, the penetration of the liquid LQ into the first vacuum system 43 via the suction ports 41 inside the space 31 can be prevented. Furthermore, each of the back surface Pb of the substrate P and the upper surface 33A of the peripheral wall portion 33 facing the back surface Pb is liquid-repellent, and the gap with a predetermined distance D2 is secured. Therefore, the penetration of the liquid LQ into the space 31 is prevented. Consequently, the penetration of the liquid LQ into the first vacuum system 43 via the suction ports 41 inside the space 31 can also be prevented. When the back surface Pb of the substrate P is made liquid-repellent, the entire region of the back surface Pb may be made liquid-repellent, or only a part of the region, of the back surface Pb, facing the upper surface 33A of the peripheral wall portion 33 may be made liquid-repellent.

Figure 5B:
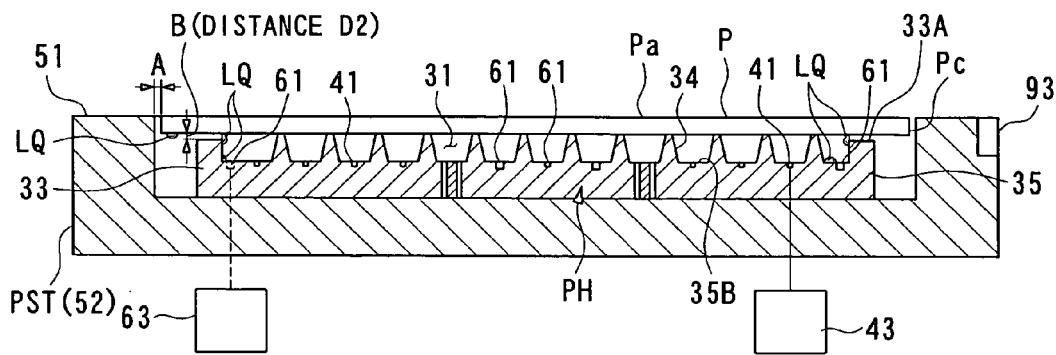
FIG. 5B is a schematic diagram illustrating an example of the exposure operation.

On completion of the scanning exposure of every shot region on the substrate P, the controller CONT stops the liquid supply by the liquid supply mechanism 10. On the other hand, the controller CONT, after stopping the liquid supply by the liquid supply mechanism 10, continues the drive of the first liquid recovery mechanism 20 for a predetermined period of time. By this operation, as shown in FIG. 5B, the liquid LQ on the front surface Pa of the substrate P and on the upper surface 51 of the Z tilt surface 52 is recovered. When the first recovery mechanism 20 is used to recover the liquid LQ on the substrate P and on the upper surface 51, the liquid LQ can be more smoothly recovered by moving the substrate stage PST in the XY direction (or in the Z-axis direction, as the case may be) with respect to the collection port 22 of the first liquid recovery mechanism 20. After recovering the liquid LQ on the substrate P, the controller CONT moves the substrate stage PST to the load/unload position for carrying in and carrying out the substrate P, and stops the drive of the first vacuum system 43 to release the attracting and holding of the substrate P by the substrate holder PH.

Figure 5C:
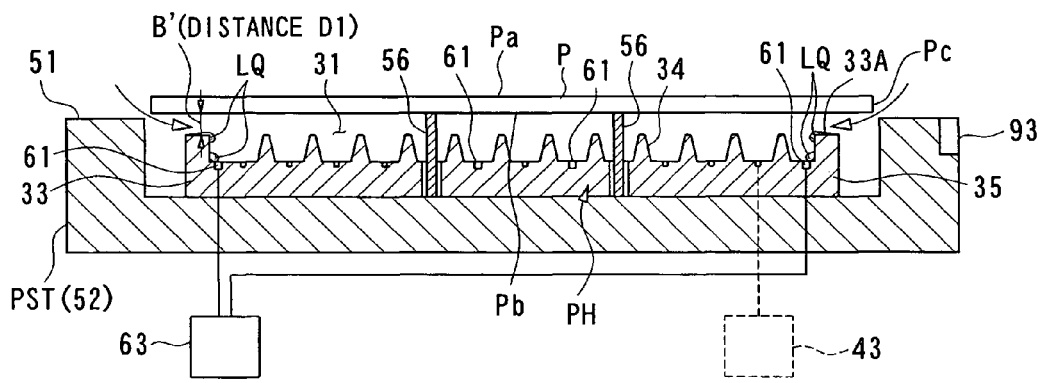
FIG. 5C is a schematic diagram illustrating an example of the exposure operation.

After releasing the attracting and holding of the substrate P by the substrate holder PH, as shown in FIG. 5C, the controller CONT forms a gap B' by raising the raising/lowering members 56 by a predetermined distance, in the state with the back surface Pb of the substrate P being held by the raising/lowering members 56. The controller CONT adjusts the distance of the gap B' between the upper surface 33A of the peripheral wall portion 33 and the back surface Pb of the substrate P by driving the raising/lowering members 56 holding the substrate P by a predetermined amount. The controller CONT then stops the drive of the raising/lowering members 56, with the upper surface 33A of the peripheral wall portion 33 and the back surface Pb of the substrate P being spaced at a predetermined distance D1. Here, the distance D1 of the gap B' is longer than the distance D2 of the gap B between the upper surface 33A of the peripheral wall portion 33 and the back surface Pb of the substrate P when the substrate P is held on the supporting portions 34 by negatively pressurizing the space 31. In other words, the distance D2 of the gap B when the substrate P is attracted and held by the substrate holder PH is shorter than the distance D1 of the gap B'.

The controller CONT then drives the second vacuum system 63 of the second liquid recovery mechanism 60, in the state with the distance D1 between the upper surface 33A of the peripheral wall portion 33 and the back surface Pb of the substrate P being maintained. The controller CONT drives the second vacuum system 63 in the state with the upper surface 33A of the peripheral wall portion 33 and the back surface Pb of the substrate P being spaced at the distance D1, and thus it is possible to recover the liquid LQ penetrated into the back surface Pb side of the substrate P via the collection ports 61 (61A to 61C).

Figure 6:
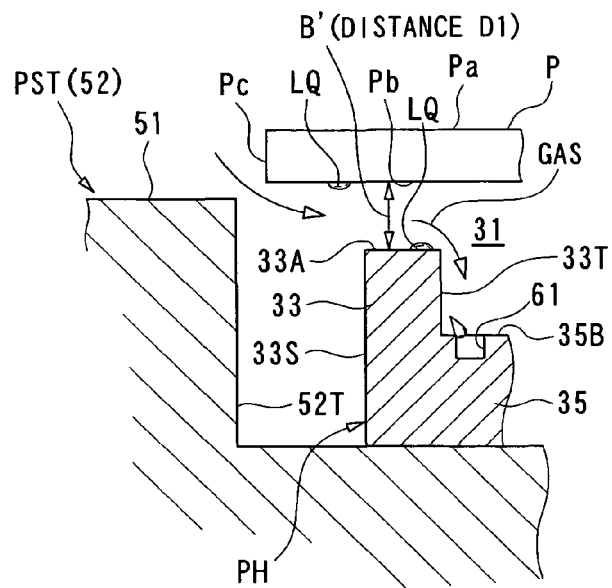
FIG. 6 is a schematic to explain a fluid flow, in the vicinity of a gap formed between an upper surface of a peripheral wall portion and a back surface of a substrate.

FIG. 6 is a schematic diagram illustrating a gas flow in the vicinity of an outer periphery of the substrate P when the second vacuum system 63 is driven, in the state with the upper surface 33A of the peripheral wall portion 33 and the back surface Pb of the substrate P being spaced at the predetermined distance D1. By driving the second vacuum system 63 in the state with the upper surface 33A of the peripheral wall portion 33 and the back surface Pb of the substrate P being spaced at the predetermined distance D1, a gas (air) in the space 31 surrounded by the base member 35, the peripheral wall portion 33, and the substrate P is sucked via the collection ports 61; thereby, the space 31 is negatively pressurized. With the space 31 being negatively pressurized, a pressure difference arises between the outside and inside of the space 31, thus generating a gas flow from the outside to the inside of the space 31 through the gap B'.

The predetermined gap A is formed between the upper surface 51 of the Z tilt stage 52 (substrate stage PST) and the substrate P. The adhesion of the liquid LQ to the side surface Pc of the substrate P through the gap A or the penetration (passing around) of the liquid LQ into the back surface Pb side of the substrate P through the gap A is prevented when the substrate P is attracted and held by the substrate holder PH prior to or during the exposure of the substrate P. However, there is still a possibility that the liquid LQ will adhere to the side surface Pc or back surface Pb of the substrate P. Furthermore, there is also a possibility that the liquid LQ penetrated will adhere to the upper surface 33A of the peripheral wall portion 33, inner surface 33T of the peripheral wall portion 33, or bottom surface 35B of the substrate holder. In this embodiment, the space 31 is negatively pressurized, in the state with the distance D1 of the gap B' being maintained at an optimal value, via the collection ports 61 to generate a fluid flow from the outside to the inside of the space 31; thereby, the liquid LQ that has penetrated from the outer periphery of the substrate P and has adhered to the back surface Pb or the side surface Pc of the substrate P, and the liquid LQ that has adhered to the substrate holder including the upper surface 33A and inner surface 33T of the peripheral wall portion 33, and bottom surface 35B can be sucked and recovered via the collection ports 61. In this case, the liquid LQ that is adhered to the back surface Pb and side surface Pc located outside the space 31 can also be well recovered by the aforementioned gas flow. Then, by negatively pressurizing the space 31 in the state with the distance D1 of the gap B' being maintained at an optimal value, the second liquid recovery mechanism 60 can recover the liquid LQ that is adhered to the back surface Pb and side surface Pc of the substrate P and the liquid LQ that is adhered to the substrate holder PH via the recovery ports 61 substantially simultaneously. Furthermore, a humid air floating in the space 31 can also be recovered, together with the liquid LQ that is adhered to the back surface Pb of the substrate P, etc., via the recovery ports 61 substantially simultaneously. Furthermore, also in the vicinity of the notch portion NT of the substrate P, the gap B' is formed with the predetermined distance D1 between the back surface Pb of the substrate P and the upper surface 33A of the peripheral wall portion 33. Therefore, the liquids LQ adhered to the back surface Pb and side surface Pc of the substrate P in the vicinity of the notch portion NT, or to the convex portion 33N' of the peripheral wall portion 33 formed corresponding to the notch portion NT, etc. can also be recovered via the collection ports 61 (61B) substantially simultaneously.

The collection ports 61 are preferably provided in the vicinity of the positions to which the liquid LQ having leaked from the outer periphery of the substrate P is likely to adhere, and preferably have a shape and an arrangement such that the flow of the gas (such as a flow rate and a direction of flow) can be in a desired state. In this embodiment, the liquid LQ having leaked from the outer periphery of the substrate P is likely to adhere to the upper surface 33A, inner surface 33T, etc. of the peripheral wall portion 33. Therefore, the liquid LQ that is adhered to the peripheral wall portion 33 can be smoothly recovered via slit-like first collection ports 61A formed along the inner surface 33T in the vicinity of the inside of the peripheral wall portion 33. Furthermore, the liquid LQ is likely to penetrate from the outer periphery of the substrate P also in the vicinity of the notch portion NT of the substrate P. Therefore, the liquid LQ can be smoothly recovered via second collection ports 61B provided in the vicinity of the concave portion 33N (convex portion 33N') in accordance with the notch portion NT of the substrate P. Furthermore, third collection ports 61C are provided in the central portion of the bottom surface 35B. Therefore, a gas flow through the gap B' can be in a desired state and the liquid LQ penetrated into the space 31 from the outer periphery of the substrate P can be more securely recovered.

Furthermore, the second liquid recovery mechanism 60 sucks and recovers the liquid LQ that is adhered to the upper surface 33A of the peripheral wall portion 33 and the back surface Pb and side surface Pc of the substrate P, those of which are provided in the passage of the gas flow, by negatively pressurizing the space 31 to generate a gas flow. However, the second liquid recovery mechanism 60 can recover not only the liquid LQ but also foreign matter (impurities, particles) adhered to the back surface Pb and side surface Pc of the substrate P, and/or the substrate holder PH. For example, it can be conceived that a part of the photoresist applied to the substrate P falls off and adheres to the substrate P and/or the substrate holder PH as foreign matter. In this case, the controller CONT drives the second liquid recovery mechanism 60, thus the foreign matter can be sucked and recovered together with the liquid LQ.

By the way, to move the liquid LQ located in the gap B' for the recovery from the collection ports 61, the second liquid recovery mechanism 60 needs to perform the suction and recovery with a force larger or bigger than the viscous resistance force of the liquid LQ. In the case where the distance D1 of the gap B' is small, the viscous resistance force of the liquid LQ located in the gap B' is large. Therefore, to move (recover) the liquid LQ located in the gap B', the second liquid recovery mechanism 60 needs to increase the suction force of the second vacuum system 63 to sufficiently reduce the pressure of the space 31. However, if the suction force of the second vacuum system 63 is increased to excessively reduce the pressure of the space 31, there is a possibility that the edge portion of the substrate P held on the raising/lowering members 56 will be subjected to bending deformation. On the other hand, in the case where the distance D1 of the gap B' is large, the flow rate of the gas flow generated through the gap B' cannot be increased, and thus it becomes difficult to move (recover) the liquid LQ located in the gap B'. Furthermore, the viscous resistance force of the liquid LQ also varies in accordance with the affinity (contact angle) of the liquid LQ for each of the upper surface 33A of the peripheral wall portion 33 and the back surface Pb of the substrate P. Furthermore, the liquid LQ in this embodiment is pure water. However, in the case where a liquid other than pure water may be used, the viscous resistance force of the liquid also varies in accordance with the physical properties (such as viscosity) of the liquid. Therefore, the distance D1 of the gap B' is preferably set in accordance with the physical properties of the liquid LQ, the affinity of the liquid LQ for each of the upper surface 33A of the peripheral wall portion 33 and the back surface Pb of the substrate P, and the suction force of the second vacuum system 63. In this embodiment, the space is set to be about −80 kP, and the gap B' is set to be about 1 μm or more and 10 mm or less.

Moreover, as described above, the surface of the substrate holder PH including the upper surface 33 A of the peripheral wall portion 33 is liquid-repellent. Therefore, the second liquid recovery mechanism 60 can smoothly recover the liquid LQ that is adhered to the surface of the substrate holder PH without excessively increasing the suction force of the second vacuum system 63, i.e., without excessively decreasing the 20 pressure of the space 31. Furthermore, even if the liquid LQ should adhere to the surface of the raising/lowering members 56, the liquid LQ can be smoothly recovered by making the surface of the raising/lowering members 56 liquid-repellent.

Figure 7:
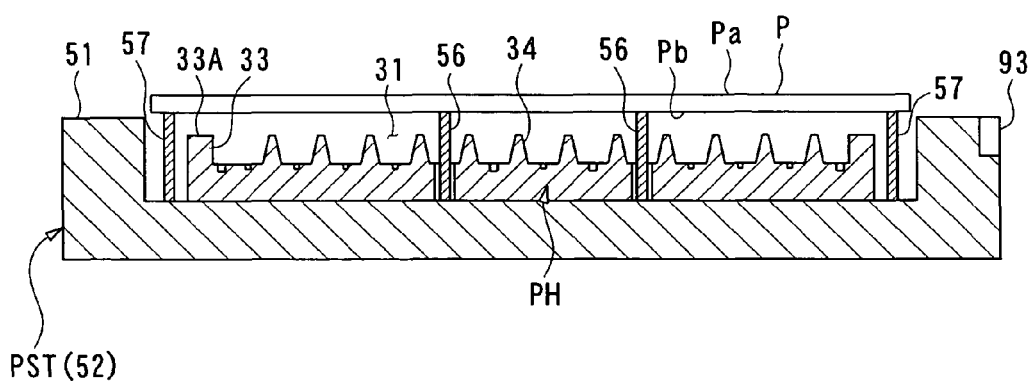
FIG. 7 is a schematic block diagram showing another embodiment of the exposure apparatus.

As shown in FIG. 7, second raising/lowering members 57 are provided on the outside of the peripheral wall portion 33 (outside the space 31), the central portion of the 25 back surface Pb of the substrate P is held on raising/lowering members 56, and the edge area of the back surface Pb of the substrate P is held on the second raising/lowering members 57. With this configuration, the bending deformation in the edge portion of the substrate P can be suppressed even when the pressure of the space 31 is decreased by increasing the suction force of the second vacuum system 63.

Figure 5D:
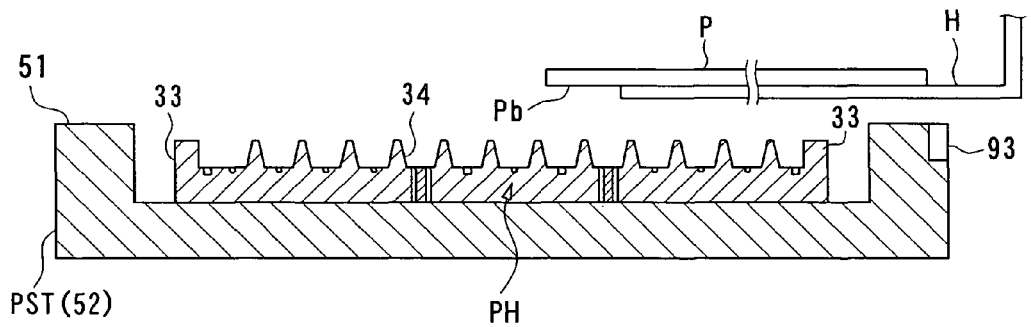
FIG. 5D is a schematic diagram illustrating an example of the exposure operation.

After completion of the liquid recovery operation by the second liquid recovery mechanism 60, the controller CONT further raises the raising/lowering members 56 holding the back surface Pb of the substrate P. Then, as shown in FIG. 5D, a transfer arm H goes into the space between the substrate P raised by the raising/lowering members 56 and the substrate holder PH, and holds the back surface Pb of the substrate P. The transfer arm H then carries out (unloads) the substrate P from the substrate holder PH.

As described above, the second liquid recovery mechanism 60 recovers the liquid LQ that is adhered to the back surface Pb and side surface Pc of the substrate P and the liquid LQ that is adhered to the substrate holder PH substantially simultaneously, and thus can recover the liquid LQ quickly in a short time. Therefore, the occurrence of disadvantages due to the liquid LQ that is adhered to the back surface Pb of the substrate P or to the substrate holder PH, for example, the occurrence of a disadvantage that the flatness (the degree of flatness) when the substrate holder PH holds the substrate P deteriorates because of the formation of a water mark on the back surface Pb of the substrate P or the upper surface(s) 34A of the supporting portion(s) 34 of the substrate holder PH, can be prevented, and thus good exposure accuracy can be maintained.

Furthermore, if the liquid LQ adheres to the back surface Pb of the substrate P or a water mark is formed on the back surface Pb of the substrate P, there is a possibility that when the substrate P is carried out (unloaded) from the substrate holder PH by using the transfer arm H, the transfer arm H cannot hold the back surface Pb of the substrate P well. Or there is a possibility that the degree of flatness of the substrate P when held on the substrate holder PH will deteriorate. Furthermore, there is also a possibility that the transfer arm H will be contaminated by contact with the liquid LQ that is adhered to the back surface Pb of the substrate P, or with a water mark formed on the back surface Pb of the substrate P. Moreover, if the substrate P is transferred with the liquid LQ that is adhered to the back surface Pb of the substrate P, a disadvantage that the liquid LQ is scattered in the transfer path from the substrate P occurs as well. Furthermore, if a predetermined process subsequent to the exposure process is performed in the state with the liquid LQ that is adhered to the back surface Pb of the substrate P or in the state with a water mark being formed on the back surface Pb of the substrate P, the process may be affected. Furthermore, when the substrate P after the exposure process is subjected to a development process and is carried in (loaded) on the substrate holder PH again for exposure of the next layer, it is possible that the substrate holder PH cannot hold the substrate P well if a water mark is formed on the back surface Pb of the substrate P. In this embodiment, the second liquid recovery mechanism 60 quickly recovers/removes the liquid LQ that is adhered to the back surface of the substrate P and the substrate holder PH before the substrate P is unloaded from the substrate holder PH. Therefore, the occurrence of the aforementioned disadvantages can be prevented.

Moreover, the second liquid recovery mechanism 60 recovers the liquid LQ quickly in a short time. Therefore, the liquid LQ having leaked from the outer periphery of the substrate P into the back surface Pb side of the substrate P or into the space 31 can be recovered before the liquid LQ evaporates. Consequently, formation of a water mark on the back surface Pb of the substrate P or on the substrate holder PH can be prevented. Furthermore, the second liquid recovery mechanism 60 can recover the liquid LQ in a short time. Therefore, the time required for the liquid recovery process can be shorter, and the availability of the exposure apparatus EX can be improved as well.

In the aforementioned embodiment, after completion of the exposure of the substrate P, the suction operation of the suction mechanism 40 is stopped to release the attracting and the holding of the substrate, and subsequently the raising/lowering members 56 are used to raise the substrate P with respect to the substrate holder PH. After that, the second liquid recovery mechanism 60 is driven to suction recover the liquid LQ. However, the suction operation of the suction mechanism 40 need not be stopped after completion of the exposure of the substrate P. For example, the gap B' with a distance D1 between the back surface Pb of the substrate P and the upper surface 33A of the peripheral wall portion 33 may be provided by using the raising/lowering members 56 to raise the substrate P with respect to the substrate holder PH, in the state with the suction force via the suction ports 41 by the suction mechanism 40 being weaker than the suction force when the substrate P is attracted and held, to be specific, in the state with the suction force being weakened to a degree that the substrate P can be raised by use of the raising/lowering members 56.

In the aforementioned embodiment, when the liquid recovery operation is performed by use of the second liquid recovery mechanism 60, the raising/lowering members 56 are used to raise the substrate P with respect to the substrate holder PH, thus forming the gap B' with the predetermined distance D1 between the back surface Pb of the substrate P and the upper surface 33A of the peripheral wall portion 33. However, as a gap adjustment mechanism that adjusts the distance between the upper surface 33A of the peripheral wall portion 33 and the back surface Pb of the substrate P, any mechanism can be adopted without limitation to the raising/lowering members 56, as long as it can adjust the distance between the back surface Pb of the substrate P and the upper surface 33A of the peripheral wall portion 33. For example, as a gap adjustment mechanism, an arm apparatus may be adopted that can move the substrate P with respect to the substrate holder PH while holding the front surface Pa or side surface Pc of the substrate P. Furthermore, the distance between the back surface Pb of the substrate P and the upper surface 33A of the peripheral wall portion 33 may be adjusted by, instead of raising the substrate P with respect to the substrate holder PH in a stationary state, lowering the substrate holder PH while the substrate P is held by a predetermined holding apparatus in the state with the position of the substrate P in the Z-axis direction being maintained. Alternatively, it may be configured such that both of the substrate P and the substrate holder PH are moved.

In the aforementioned embodiment, the gap B during the exposure of the substrate P has the distance D2, and the gap B' when the liquid recovery operation is performed, after completion of the exposure of the substrate P, by the second liquid recovery mechanism has the distance D1, which is longer than the distance D2. However, it may be configured such that the substrate P is exposed in the state with the distance D2 of the gap B being maintained, and that the suction operation is performed via the collection ports 61 to negatively pressurize the space 31 in the state with the distance D2 of the gap B being maintained even after the exposure of the substrate P, without changing the relative position in the Z-axis direction between the substrate P and the substrate holder PH (without raising the substrate P by means of the raising/lowering members 56). Furthermore, it may be configured such that the liquid LQ that is adhered to the back surface Pb or side surface Pc of the substrate P or to the substrate holder PH is sucked and recovered by negatively pressurizing the space 31 and generating a gas flow. In this case, the suction force by the second liquid recovery mechanism 60 is made larger than the suction force by the suction mechanism 40 when, during the exposure of the substrate P, the substrate P is attracted and held by the substrate holder PH to generate a gas flow through the gap B, and thus the liquid LQ that is adhered to the back surface Pb of the substrate P and the substrate holder PH can be recovered. On the other hand, when the liquid is recovered, the probability of occurrence of bending deformation of the substrate P becomes high if the gas in the space 31 is removed with a suction force stronger than when the substrate P is attracted and held during the exposure. Therefore, the liquid recovery operation is preferably performed with the optimal distance D1 and the optimal suction force, in the state with the distance D2 between the back surface Pb of the substrate P and the upper surface 33A of the peripheral wall portion 33 when the substrate P is attracted and held by the substrate holder PH and the distance D1 between the back surface Pb of the substrate P and the upper surface 33A of the peripheral wall portion 33 when the liquid LQ is recovered by use of the second liquid recovery mechanism 60 being different as in the above-described embodiment.

In the aforementioned embodiment, it is configured such that to secure the distance D1 of the gap B' when performing the liquid recovery operation by the second liquid recovery mechanism 60, the controller CONT monitors a drive amount of the driving unit for driving the raising/lowering members 56, acquires the raised amount (position of the raising/lowering members 56) based on the monitored results (drive amount of the driving unit), and derives the distance D1 between the upper surface 33A of the peripheral wall portion 33 and the back surface Pb of the substrate P based on the acquired results. On the other hand, it may be configured such that a measurement apparatus is provided that measures the distance between the upper surface 33A of the peripheral wall portion 33 and the back surface Pb of the substrate P, and that the controller CONT controls the drive of the raising/lowering members 56 based on the measurement results from the measurement apparatus to adjust the distance between the upper surface 33A of the peripheral wall portion 33 and the back surface Pb of the substrate P.

Figure 8:
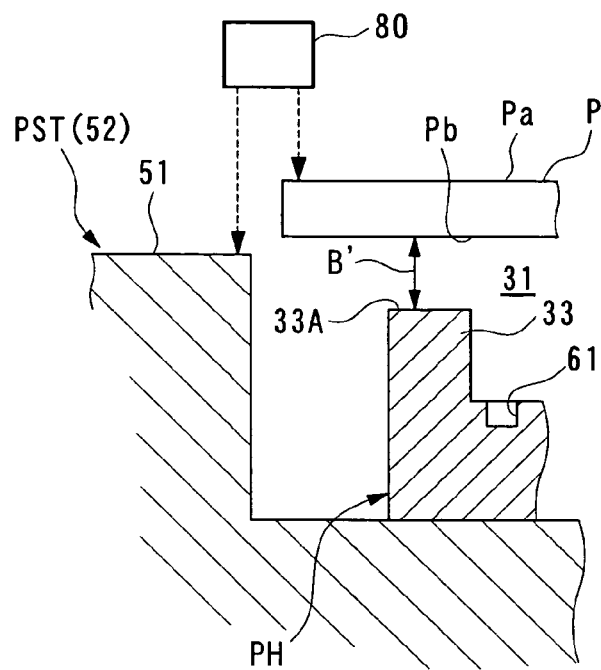
FIG. 8 is a schematic diagram illustrating an example of a measurement apparatus.

FIG. 8 is a schematic diagram illustrating an example of a measurement apparatus 80 that measures the distance between the upper surface 33A of the peripheral wall portion 33 and the back surface Pb of the substrate P. The measurement apparatus 80 shown in FIG. 8 is constituted by a laser interferometer, and radiates a reference beam onto the upper surface 51 of the Z tilt stage 52 and a measurement beam onto the front surface Pa of the substrate P. Each of the reference beam irradiation region on the upper surface 51 of the Z tilt stage 52 and the measurement beam irradiation region on the front surface Pa of the substrate P is a surface that can reflect the corresponding beam. Here, in the measurement apparatus 80 (or a storage device connected to the measurement apparatus 80) is stored information on the distance in the Z-axis direction between the upper surface 51 of the Z tilt stage 52 and the upper surface 33A of the peripheral wall portion 33 and information on the distance in the Z-axis direction between the front surface Pa and back surface Pb of the substrate P (that is, the thickness of the substrate P). The measurement apparatus 80 can acquire the distance D1 of the gap B' between the upper surface 33A of the peripheral wall portion 33 and the back surface Pb of the substrate P based on the difference between the optical path length of the reference beam radiated onto the upper surface 51 and the optical path length of the measurement beam radiated onto the front surface Pa of the substrate P, and on the aforementioned stored information.

In the above-described embodiment, the liquid recovery operation by the second liquid recovery mechanism 60 is performed after completion of the exposure of the substrate P, prior to carrying out of the exposure-processed substrate P from the substrate stage PST. However, the liquid recovery operation by the second liquid recovery mechanism 60 may be performed after the unexposed substrate P to be exposed is transferred (loaded) onto the substrate stage PST, before the substrate P is attracted and held by the substrate holder PH. There is a possibility that foreign matter has adhered to the back surface Pb of the substrate P before it is loaded on the substrate stage PST and that foreign matter and/or liquid LQ has adhered also to the substrate holder PH before the substrate P is loaded. Thus, by performing the liquid recovery operation (foreign matter recovery operation) by the second liquid recovery mechanism 60 prior to loading the substrate P, the substrate P can be held well on the substrate holder PH with good flatness, in the state with the liquid LQ and foreign matter being removed.

In the above-described embodiment, the liquid recovery operation by the second liquid recovery mechanism 60 is performed after completion of the exposure of the substrate P, prior to unloading the substrate P from the substrate stage PST (substrate holder PH). In this case, the liquid recovery operation is preferably performed every time the substrate P is unloaded (for every substrate P). By doing so, for example, the occurrence of a disadvantage can be prevented that the liquid LQ is scattered in the transfer path as a result of the substrate P unloaded from the substrate stage PST with the liquid LQ that is adhered to the back surface Pb of the substrate P.

Figure 9:
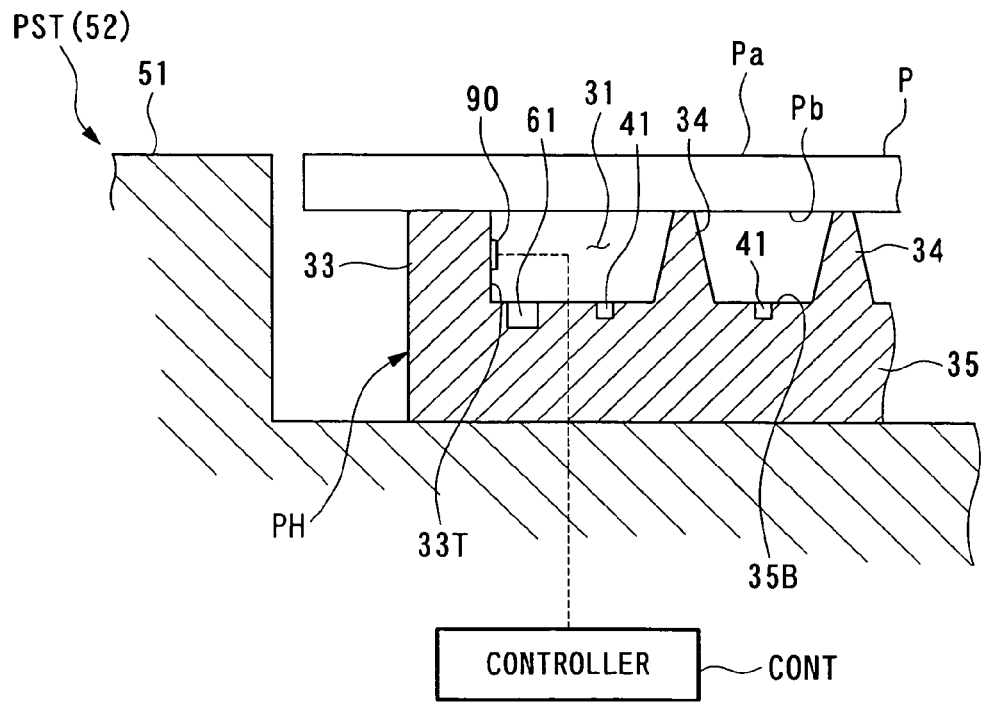
FIG. 9 is a schematic diagram illustrating an example of a detection apparatus.

On the other hand, as shown in FIG. 9, it may be configured such that a detection apparatus 90 that can detect the liquid LQ is provided at a predetermined position on the substrate holder PH, and that the controller CONT controls the operation of the second liquid recovery mechanism 60 based on the detection results from the detection apparatus 90. In FIG. 9, the detection apparatus 90 is constituted by a liquid presence/absence sensor that can detect the presence or absence of the liquid LQ by contact with the liquid LQ. The detection apparatus 90 is provided at a position to which the liquid LQ having leaked from the outer periphery of the substrate P into the space 31 is likely to adhere, to be specific, on the inner surface 33T of the peripheral wall portion 33. Furthermore, it is configured such that the detection apparatus 90 can detect whether or not the liquid LQ having leaked from the outer periphery of the substrate P has adhered to the substrate holder PH. The detection apparatus can also detect whether or not the liquid LQ has adhered to the back surface Pb of the substrate P, if it is provided at a position that allows a detection of whether or not the liquid LQ has adhered to the back surface Pb or side surface Pc of the substrate P. Alternatively, a detection apparatus that detects the presence or absence of the liquid LQ, for example, in an optically non-contact manner may be adopted and the controller CONT may determine whether or not the liquid LQ has adhered to at least one of the back surface Pb (side surface Pc) of the substrate P and the substrate holder PH based on the detection results from the aforementioned detection apparatus.

When the detection apparatus 90 detects, during the exposure of the substrate P or in the unload operation of the substrate P, the liquid LQ having leaked from the outer periphery of the substrate P, the controller CONT, before unloading the substrate P from the substrate stage PST, uses the second liquid recovery mechanism 60 to suction recover the liquid LQ that is adhered to the back surface Pb or side surface Pc of the substrate P or to the substrate holder PH. On the other hand, when the detection apparatus 90 does not detect the liquid LQ during the exposure of the substrate P or in the unload operation of the substrate P, the controller CONT unloads the substrate P by delivering it to the transfer arm after completion of the exposure of the substrate P without performing the liquid recovery operation by the second liquid recovery mechanism 60. Thus, by providing the detection apparatus 90 that detects whether or not the liquid LQ has adhered to at least one of the back surface Pb (side surface Pc) of the substrate P and the substrate holder PH, the controller CONT does not perform the liquid recovery operation by the second liquid recovery mechanism 60 when it determines that the liquid LQ has not adhered to the back surface Pb, the side surface Pc of the substrate P, or to the substrate holder PH based on the detection results from the detection apparatus 90. Thus, the availability of the exposure apparatus EX can be improved, since it is configured such that an unnecessary liquid recovery operation is not performed. Furthermore, when the liquid LQ is detected by the detection apparatus 90, performing the liquid recovery operation by the second liquid recovery mechanism 60 can prevent the occurrence of disadvantages such as formation of a water mark due to the adherent liquid LQ or adhesion of the liquid LQ to the transfer arm. Furthermore, it may be configured such that the detection apparatus 90 is used to confirm (detect) whether or not the liquid LQ has been recovered (removed) after performing the liquid recovery operation by the second liquid recovery mechanism 60; and that in the case where it is determined that the liquid LQ has not been recovered based on the detection result, the controller CONT performs again the liquid recovery operation by the second liquid recovery mechanism 60.

Furthermore, it may be configured such that the detection apparatus is used to detect, during the exposure of the substrate P, whether or not the liquid LQ has adhered to at least one of the back surface Pb of the substrate P and the substrate holder PH; and that in the case where the detection apparatus 90 detects the liquid LQ, the controller CONT stops (suspends) the exposure operation including the irradiation operation of the exposure light EL onto the substrate P and the operation of attracting and holding the substrate P by the substrate holder PH (the suction operation by the first vacuum system 43). Furthermore, after stopping the exposure operation, the controller CONT may use the second liquid recovery mechanism 60 to recover the liquid LQ. On the other hand, in the case where the detection apparatus 90 does not detect the liquid LQ during the exposure of the substrate P, the controller CONT continues the exposure operation onto the substrate P, and carries out (unloads) the substrate P after completion of the substrate P without performing the liquid recovery operation by the second liquid recovery mechanism 60. By stopping the exposure operation including the suction operation by the first vacuum system 43 when the detection apparatus 90 detects the liquid LQ, the occurrence of such disadvantages can be prevented that the liquid penetrated into the space 31 flows in the first vacuum system 43 via the suction ports 41, causing damage to the first vacuum system 43.

On the other hand, even in the case where the detection apparatus 90 detects the liquid LQ during the exposure of the substrate P, the exposure operation may be continued until the exposure of all the shot areas (or specified shot area(s)) on the substrate P is completed without performing the liquid recovery operation by the second liquid recovery mechanism 60. In this case, by adopting the configuration in which the suction mechanism 40 can suck and recover the liquid LQ via the suction ports 41, for example, with a gas-liquid separator being provided on the upstream side of the first vacuum system 43, damage, etc. to the first vacuum system 43 can be prevented even if the liquid LQ flows in the suction ports 41.

Furthermore, by adopting the configuration in which the suction mechanism 40 can suck and recover the liquid LQ via the suction ports 41, for example, with a gas-liquid separator being provided on the upstream side of the first vacuum system 43, the liquid recovery operation via the suction ports 41 may be performed in parallel with the liquid recovery operation via the liquid collection ports 61 of the second liquid recovery mechanism 60. That is, also in the liquid recovery operation by the second liquid recovery mechanism 60, it is not necessarily required that the drive of the suction mechanism 40 be stopped.

Alternatively, the suction ports 41 for negatively pressurizing the space 31, when the substrate P is to be supported by the supporting portions 34, may be used also as the collection ports 61 of the second liquid recovery mechanism 60. That is, when the space 31 is negatively pressurized for the substrate P to be attracted-and-held by the substrate holder PH, the first vacuum system 43 is driven to suck the gas in the space 31 from the suction ports 41; when the raising/lowering members 56 are used to raise the substrate P after completion of the exposure of the substrate P, the suction operation by means of suction ports 41 is stopped or the suction force is decreased. Then, after the raising/lowering members 56 are used to adjust the distance D1 between the back surface Pb of the substrate P and the upper surface 33A of the peripheral wall portion 33 to the optimal value, the suction force via the suction ports 41 is set to a predetermined value to recover the liquid LQ via the suction ports 41. Using the suction ports 41 for attracting and holding the substrate P also as the collection ports (61) for recovering the liquid LQ eliminates the need for providing the second vacuum system 63 and the channel 62, and thus the configuration of the apparatus can be simplified. On the other hand, as in the above-described embodiment, by providing the suction ports 41 for attracting and holding the substrate P and the collection ports 61 independently, the suction ports can be provided in any position. Therefore, the collection ports 61 can be provided in the positions to which the liquid LQ having leaked from the outer periphery of the substrate P is likely to adhere, and the liquid LQ can be more securely recovered. Furthermore, the shape and location position of the collection ports 61 can be optimally set. Therefore, the gas flow through the gap B' can be in a desired state.

Figure 10:
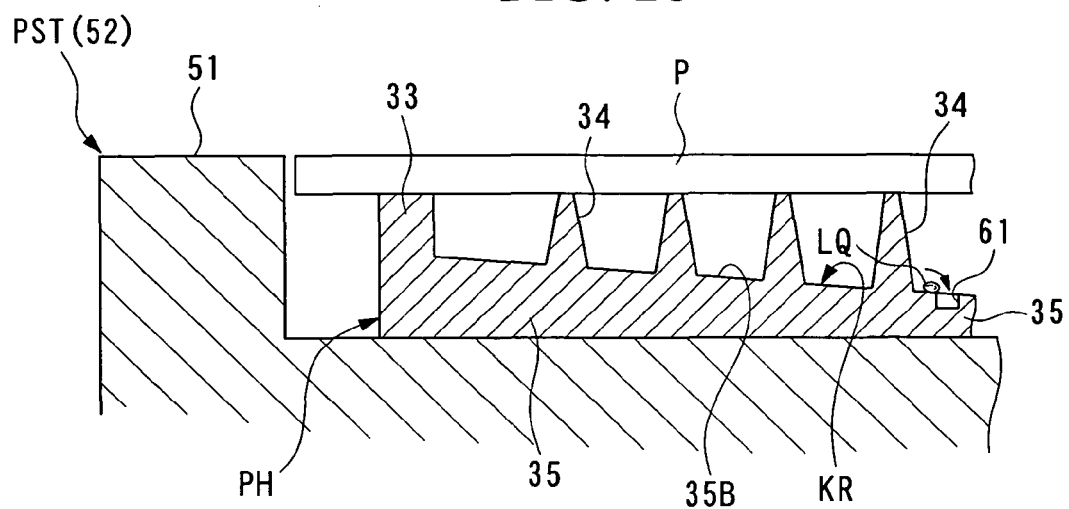
FIG. 10 is a view showing another embodiment of the substrate holder.

In the aforementioned embodiment, it is configured such that the bottom surface 35B of the substrate holder PH is formed substantially in parallel with the XY plane and that the collection ports 61 of the second liquid recovery mechanism 60 are provided in the predetermined positions on the bottom surface 35B. However, it may be configured such that as shown in FIG. 10, inclined regions KR that are inclined downward toward the collection ports 61 are provided in the bottom surface 35B. With this configuration, the second liquid recovery mechanism 60 can more smoothly recover the liquid LQ that has penetrated into the space 31 from the outer periphery of the substrate P and has adhered to the bottom surface 35B because of the weight of the liquid LQ itself (action of gravity) and the suction force via the collection ports 61.

Figure 11:
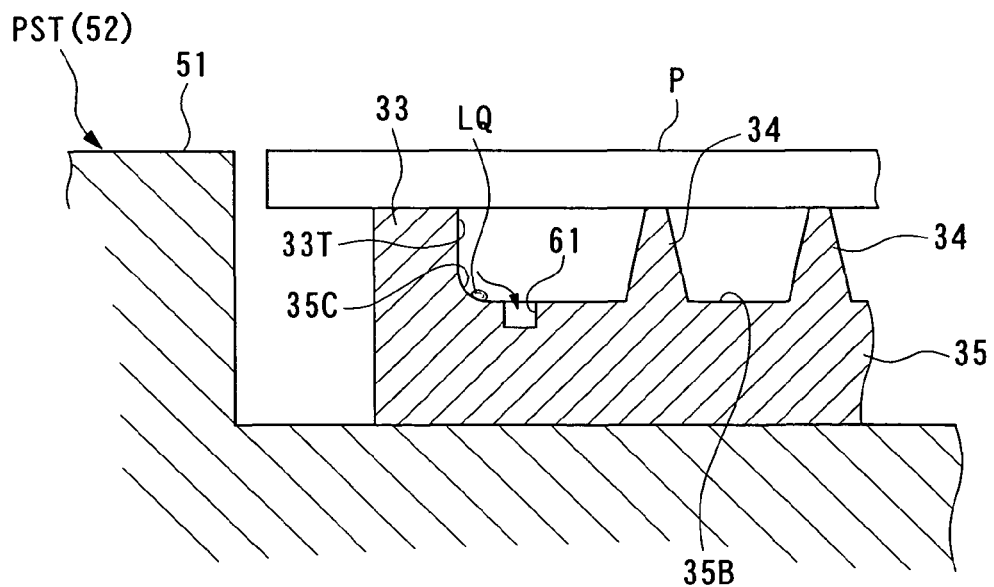
FIG. 11 is a view showing still another embodiment of the substrate holder.

Furthermore, in the above-described embodiment, the bottom surface 35B and the inner surface 33T of the peripheral wall portion 33 are substantially orthogonal to each other. However, a connection portion 35C between the inner surface 33T of the peripheral wall portion 33 and the bottom surface 35B may be formed in a substantially arc shape in a sectional view, as shown in FIG. 11. With this configuration, the liquid LQ that is adhered to the inner surface 33T of the peripheral wall portion 33 can be smoothly recovered from the collection ports 61 provided in the vicinity of the inner surface 33T in a manner as if it flowed down the arc-shaped connection portion 35C.

In the above-described embodiment, it may be configured such that a nozzle, with a collection port, which is movable along the gap B' is provided and that a gas flow is generated by performing the suction recovery operation while moving the nozzle along the gap B'.

Furthermore, it may be configured such that collection port(s) are further provided in position(s) that connect to the gap C, for example, in the inner surface SOT of the Z tilt stage 52, or in the outer surface 33S of the peripheral wall portion 33, etc., and that the liquid LQ having leaked from the gap A is recovered via the collection port(s). The penetration of the liquid LQ or foreign matter into the space 31 can be prevented also by the suction operation via the collection port(s) connecting to the gap C. Furthermore, collection port(s) may be provided in the upper surface 33A of the peripheral wall portion 33. The penetration of the liquid LQ or foreign matter into the space 31 can be prevented also by the suction operation via the collection port(s) provided in the upper surface 33A of the peripheral wall portion 33.

Furthermore, a liquid recovery mechanism that recovers a liquid that is adhered to the back surface of a substrate, etc. is not limited to the one with the configuration, as described above, in which the liquid is recovered via the collection ports provided on the inside of the substrate holder PH. For example, the collection ports may be located in positions outside of (on the outer periphery side of) the substrate holder PH. For example, a configuration, as disclosed in PCT International Publication No. WO 2004/112108 A1, may be adopted in which collection ports are provided on the outside of the substrate holder and in part of (inside) the substrate stage, and that a liquid is recovered via a channel a part of which is installed inside the substrate stage. As long as it is configured such that the liquid that is adhered to the substrate can be recovered, the collection port and its channel may be installed in any position.

Figure 12:
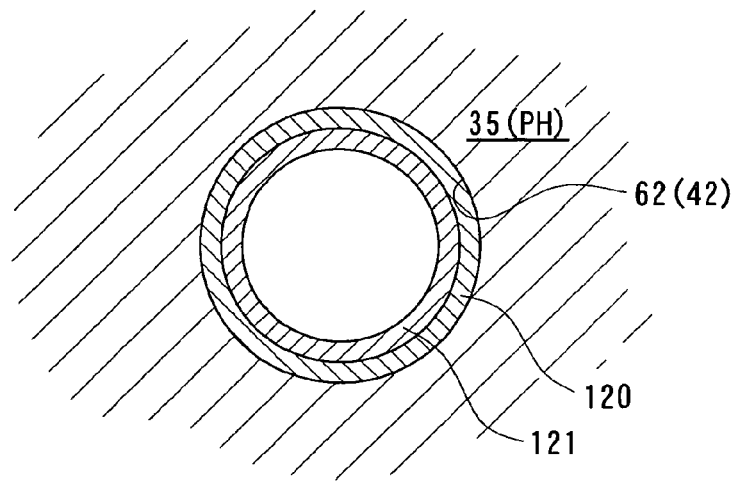
FIG. 12 is a sectional view showing an embodiment of a channel formed inside a substrate holder.

In the above-described embodiment, at least one of a liquid-repellent material and a heat-insulating material may be provided on both (or either) of the inner wall surfaces of the channel 42 that are provided on the inside of the substrate holder PH and that connects the suction ports 41 and the first vacuum system 43, and the inner wall surface of the channel 62 that connects the collection ports 61 and the second vacuum system 63. FIG. 12 is a sectional view schematically showing the channel 62 (or channel 42). In the example shown in this figure, a heat-insulating material is coated on the inner wall surface of the channel 62 to provide a heat-insulating layer 120, and on top of the heat-insulating layer 120 is coated a liquid-repellent material to provide a liquid-repellent layer 121. The liquid recovered from the collection ports 61 (or suction ports 41) flows through the channel 62 (42). The liquid LQ remaining in the channel 62 (42) can be prevented by making the surface, of the channel 62 (42), that comes into contact with the liquid LQ liquid-repellent. That is, since the flow rate of the gas flow generated by the vacuum system becomes substantially zero in the vicinity of the inner surface of the channel, there is a high possibility that the liquid that is adhered to the inner wall surface will remain inside the channel without being recovered. Furthermore, in the case where an angular portion is formed in the channel, there is a high possibility that the liquid will remain in the angular portion. If the liquid LQ remains in the channel, there occurs the possibility that heat of vaporization of the liquid LQ will subject the substrate holder PH (base member 35) to heat deformation. However, by providing the liquid-repellent layer 121 to make the inner wall surface of the channel 62 liquid-repellent, the frictional resistance between the inner wall surface and the liquid LQ can be decreased and the liquid LQ in the channel can be recovered well with the gas flow generated by the vacuum system. Therefore, the heat deformation of the substrate holder PH (base member 35) can be prevented. Here, a fluorine-based resin material, or an acrylic resin material, etc. as described above can be used as a liquid-repellent material for forming the liquid-repellent layer 121.

Furthermore, by providing the heat-insulating layer 120, even if the liquid LQ remaining in the channel should be evaporated, the influence of the heat of vaporization on the substrate holder PH (base member 35) can be suppressed.

Here, as a heat-insulating material for forming the heat-insulating layer 120, any material can be used as long as it has a coefficient of thermal conductivity $\lambda$ lower than that of the material that forms the substrate holder PH (base member 35). For example, in the case where the substrate holder PH (base member 35) is formed of a ceramic material ($\lambda$: about 63 W/mK), a fluorine-based resin material ($\lambda$: about 0.25 W/mK) such as polytetrafluoroethylene (PTFE) or tetrafluoroethylene-perfluoroalkylvinyl ether copolymer (PFA), or GORE-TEX (registered trademark), etc. may be used as the heat-insulating layer 120. Alternatively, a layer of air, which has a low coefficient of thermal conductivity $\lambda$, may be used as the heat-insulating layer 120. Here, the aforementioned fluorine-based resin material also has liquid-repellency. Therefore, both functions of liquid-repellency and heat-insulation can be obtained by coating the inner wall surface of the channel 62 (42) with the fluorine-based resin material.

As described above, the liquid LQ of this embodiment is constituted by pure water. Pure water has advantages in that it can be easily obtained in large quantity at semiconductor manufacturing plants, etc. and in that it has no adverse effects on the photoresist on the substrate P and on the optical elements (lenses), etc. Furthermore, pure water has no adverse effects on the environment and contains very few impurities. Thus, an action whereby the surface of the substrate P and the surface of the optical element provided on the tip end surface of the projection optical system PL are cleaned can also be expected. In the case where the purity of the pure water supplied from plants, etc. is low, the exposure apparatus may be adapted to have an extra pure water production apparatus.

Furthermore, the index of refraction n of pure water (water) with respect to the exposure light EL with a wavelength of about 193 nm is said to be nearly 1.44, and thus when ArF excimer laser light (wavelength: 193 nm) is used as the light source of the exposure light EL, there is a possibility to shorten the wavelength to 1/n, that is, approximately 134 nm on the substrate P, to obtain high resolution. Moreover, the depth of focus is expanded by approximately n times, that is, approximately 1.44 times, compared with that in air. Therefore, when it would be permissible to ensure about the same level of depth of focus as the case in which it is used in air, there is a possibility to further increase the numerical aperture of the projection optical system PL, and resolution improves due to this point as well.

It is to be noted that when the liquid immersion method is used as described above, the numerical aperture NA of the projection optical system may become 0.9 to 1.3. When, in this manner, the numerical aperture NA of the projection optical system becomes large, random-polarized light conventionally used as the exposure light may, because of its polarization effect, adversely affect the imaging performance; thus, a polarized light illumination method is preferably used. In this case, it is preferable that by performing-linearly polarized light illumination in which the longitudinal direction of the line pattern of the line-and-space pattern on the mask (reticle) is aligned with the polarization direction, a lot of diffraction light from S polarization components (TE polarization components), i.e., the diffraction lights from the polarization components having the polarization direction in line with the longitudinal direction of the line pattern are emitted from the pattern of the mask (reticle). When the space between the projection optical system PL and the resist applied to the surface of the substrate P is filled with the liquid, the light transmittance at the resist surface of the diffraction light from S polarization components (TE polarization components), which contribute to the improvement of the contrast, is higher compared with the case where the space between the projection optical system PL and the resist applied to the surface of the substrate P is filled with the gas (air), a high imaging performance can be obtained even in the case where the numerical aperture NA of the projection optical system is over 1.0. Furthermore, a phase shift mask, an oblique entrance illumination method (in particular, the dipole illumination method), as disclosed in Japanese Unexamined Patent Application, First Publication No. H06-188169, in which the illumination direction is aligned with the longitudinal direction of the line pattern, etc. may be appropriately combined with the above configuration, which works more effectively. In particular, the combination of the linearly polarized light illumination method and the dipole illumination method works effectively in the case where periodic directions of the line-and-space pattern are limited to a predetermined single direction, or in the case where hole patterns are densely populated along a predetermined single direction. For example, in the case where a halftone phase shift mask (a pattern with a halfpitch of about 45 nm) with a light transmittance of 6% is exposed by concurrent used of the linearly polarized light illumination method and the dipole illumination method, the depth of focus (DOF) can be increased by about 150 nm compared with the use of random-polarized light, if illumination σ defined by the circumcircle of the two light fluxes forming a dipole on the pupil surface of the illumination system is set to 0.95; the radius of each light flux on the pupil surface is set to 0.125σ; and the numerical aperture of the projection optical system PL is set as NA=1.2.

Furthermore, for example, when by using, for example, ArF excimer laser light as the exposure light and using the projection optical system PL having a reduction magnification of about ¼, a fine line-and-space pattern (e.g., line-and-space of about 25 to 50 nm) is exposed onto the substrate P, depending on the structure of the mask M (e.g., the fineness of the pattern or the thickness of chrome), the mask M acts as a polarization plate due to the wave guide effect, and a greater amount of the diffraction light from S polarization components (TE polarization components) comes to be emitted from the mask M than the amount of the diffraction lights from P polarization components (TM polarization components) which lower the contrast. In this case, the above-described linearly polarized light illumination is desirably employed. However, also by illuminating the mask M with random-polarized light, high resolution performance can be obtained even in the case where the numerical aperture NA of the projection optical system PL is large, e.g., 0.9 to 1.3.

Furthermore, when a very fine line-and-space pattern on the mask M is exposed onto the substrate P, there is a possibility that the emitted amount of the diffraction lights from P polarization components (TM polarization components) becomes larger than the emitted amount of the diffraction light from S polarization components (TE polarization components) due to the wire grid effect. However, for example, when by using ArF excimer laser light as the exposure light and using the projection optical system PL having a reduction magnification of about ¼, a line-and-space pattern of more than 25 nm is exposed onto the substrate P, a greater amount of the diffraction light from S polarization components (TE polarization components) is emitted from the mask M than the amount of the diffraction lights from P polarization components (TM polarization components). Therefore, high resolution performance can be obtained even in the case where the numerical aperture NA of the projection optical system is large, e.g., 0.9 to 1.3.

Furthermore, not only the linearly polarized light illumination (S polarized light illumination) in which the longitudinal direction of the line pattern on the mask (reticle) is aligned with the polarization direction, but also the combination, as disclosed in Japanese Unexamined Patent Application, First Publication No. H06-53120, of the polarized light illumination method, in which the lights used are linearly polarized in the tangential (circumpherential) directions relative to a circle, of which center is the optical axis, and an oblique entrance illumination method is effective. In particular, in the case where not only line patterns which extend in a predetermined single direction but also line patterns which extend in multiple different directions are included (line-and-space patterns with different periodic directions are included) in the pattern of the mask (reticle), by using, as also disclosed in Japanese Unexamined Patent Application, First Publication No. H06-53120, the polarized light illumination method, in which the lights used are linearly polarized in the tangential directions relative to a circle, of which center is the optical axis, in combination with an orbicular zone illumination method, high resolution performance can be obtained even in the case where the numerical aperture NA of the projection optical system is large. For example, in the case where a halftone phase shift mask (a pattern with a halfpitch of about 63 nm) with a light transmittance of 6% is illuminated by using the linearly polarized light illumination method in which the lights used are linearly polarized in the tangential directions relative to a circle, of which center is the optical axis, in combination with the orbicular zone illumination method (orbicular zone ratio of ¾), the depth of focus (DOF) can be increased by about 250 nm compared with the use of random-polarized light, if illumination σ is set to 0.95; and the numerical aperture of the projection optical system PL is set as NA=1.00. Furthermore, in the case of a pattern with a halfpitch of about 55 nm and the numerical aperture of the projection optical system NA=1.2, the depth of focus can be increased by about 100 nm.

In this embodiment, the optical element 2 is attached to the end of the projection optical system PL, and by this lens, the optical characteristics of the projection optical system PL, for example, aberration (spherical aberration, coma aberration, etc.) can be adjusted. As the optical element to be attached to the end of the projection optical system PL, an optical plate used for the adjustment of the optical characteristics of the projection optical system PL may be utilized. Alternatively, a plane parallel plate that can transmit the exposure light EL may be utilized.

In the case where the pressure, caused by the flow of the liquid LQ, of the space between the optical element located at the end of the projection optical system PL and the substrate P is high, it may be configured such that the optical element is rigidly fixed so as not to move due to the pressure, instead of making the optical element replaceable.

In this embodiment, it is configured such that the space between the projection optical system PL and the surface of the substrate P is filled with the liquid LQ. However, it may be configured, for example, such that the space is filled with the liquid LQ in the state with a cover glass constituted by a plane parallel plate being attached to the surface of the substrate P.

It is to be noted that the liquid LQ of this embodiment is water, but it may be a liquid other than water. For example, when the light source of the exposure light EL is an $F_2$ laser, the $F_2$ laser light does not transmit through water. Therefore, as the liquid LQ, a fluorofluid that can transmit the $F_2$ laser light, such as perfluoropolyether (PFPE) or fluorochemical oil, may be used. In this case, the part that comes into contact with the liquid LQ is subjected to lyophilic treatment by forming a thin film using a substance with a molecular structure that has a small polarity including fluorine. Furthermore, as the liquid LQ, a material (e.g., cedar oil) that can transmit the exposure light EL, has a high refractive index as high as practicable, and does not affect the projection optical system PL or the photoresist applied to the surface of the substrate P can also be used. Also in this case, the surface treatment is performed in accordance with the polarity of the liquid LQ to be used.

As for the substrate P of each of the above-described embodiments, not only a semiconductor wafer for manufacturing a semiconductor device can be used, but also a glass substrate for a display device, a ceramic wafer for a thin film magnetic head, a master mask or reticle (synthetic quartz or silicon wafer) for use in an exposure apparatus, etc. can be used.

As for the exposure apparatus EX, a step-and-scan type exposure apparatus (scanning stepper) in which while synchronously moving the mask M and the substrate P, the pattern of the mask M is scan-exposed, and besides, a step-and-repeat type projection exposure apparatus (stepper) in which the pattern of the mask M is exposed at one time in the condition that the mask M and substrate P are stationary and the substrate P is successively moved stepwise can be used.

Moreover, as for the exposure apparatus EX, the present invention can be applied to an exposure apparatus of a method in which a reduced image of a first pattern is exposed in a batch on the substrate P by using the projection optical system (for example, a refractive projection optical system having, for example, a reduction magnification of $\frac{1}{8}$, which does not include a reflecting element), in the state with the first pattern and the substrate P being substantially stationary. In this case, the present invention can be also applied to a stitch type batch exposure apparatus in which after the reduced image of the first pattern is exposed in a batch, a reduced image of a second pattern is exposed in a batch on the substrate P, partially overlapped on the first pattern by using the projection optical system, in the state with the second pattern and the substrate P being substantially stationary. Furthermore, as for a stitch type exposure apparatus, a step-and-stitch type exposure apparatus in which at least two patterns are transferred onto the substrate P in a partially overlapping manner and in which the substrate P is successively moved can be used.

Furthermore, the present invention can also be applied to a twin-stage type exposure apparatus as disclosed for example in Japanese Unexamined Patent Application, First Publication No. H10-163099, Japanese Unexamined Patent Application, First Publication No. H10-214783, Published Japanese Translation No. 2000-505958 of the PCT International Application.

Furthermore, in the aforementioned embodiment, an exposure apparatus that locally fills a liquid between a projection optical system PL and a substrate P is adopted. However, the present invention can be applied to a liquid immersion exposure apparatus, as disclosed in Japanese Unexamined Patent Application, First Publication No. H06-124873, in which a stage that holds a substrate to be exposed is moved in a liquid tank.

The types of exposure apparatuses EX are not limited to exposure apparatuses for semiconductor element manufacture that expose a semiconductor element pattern onto a substrate P but are also widely applicable to exposure apparatuses for the manufacture of liquid crystal display elements and for the manufacture of displays, and exposure apparatuses for the manufacture of thin film magnetic heads, image pickup devices (CCDs), and reticles or masks.

When using a linear motor (see U.S. Pat. No. 5,623,853 or U.S. Pat. No. 5,528,118) in the substrate stage PST or the mask stage MST, either an air-cushion type linear motor that uses an air bearing or a magnetic levitation type linear motor that uses a Lorentz force or reactance force may be used. Furthermore, the respective stages PST, MST may be types that move along a guide or may be guideless types in which a guide is not provided.

As the driving mechanism for the respective stages PST, MST, a planar motor in which by making a magnet unit in which magnets are two-dimensionally arranged and an armature unit in which coils are two-dimensionally arranged face each other, each of substrate stage PST and mask stage MST is driven by an electromagnetic force may be used. In this case, either one of the magnet unit and the armature unit is attached to the stage PST or the stage MST, and the other unit is attached to the moving surface side of the stage PST or the stage MST.

A reaction force generated by the movement of the substrate stage PST may be, as described in Japanese Unexamined Patent Application, First Publication No. H08-166475 (U.S. Pat. No. 5,528,118), mechanically released to the floor (earth) by use of a frame member so that the force does not transmit to the projection optical system PL.

A reaction force generated by the movement of the mask stage MST may be, as described in Japanese Unexamined Patent Application, First Publication No. H08-330224 (U.S. patent application Ser. No. 08/416,558), mechanically released to the floor (earth) by use of a frame member so that the force does not transmit to the projection optical system PL.

As described above, the exposure apparatus EX of the embodiments of this application is manufactured by assembling various subsystems, including the respective constituent elements presented in the Scope of Patents Claims of the present application, so that the prescribed mechanical precision, electrical precision and optical precision can be maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems. The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly to the exposure apparatuses of the various subsystems has ended, overall assembly is performed, and the various precisions are ensured for the exposure apparatus as a whole. Note that it is preferable that the manufacture of the exposure apparatus be performed in a clean room in which the temperature, the degree of cleanliness, etc. are controlled.

Figure 13:
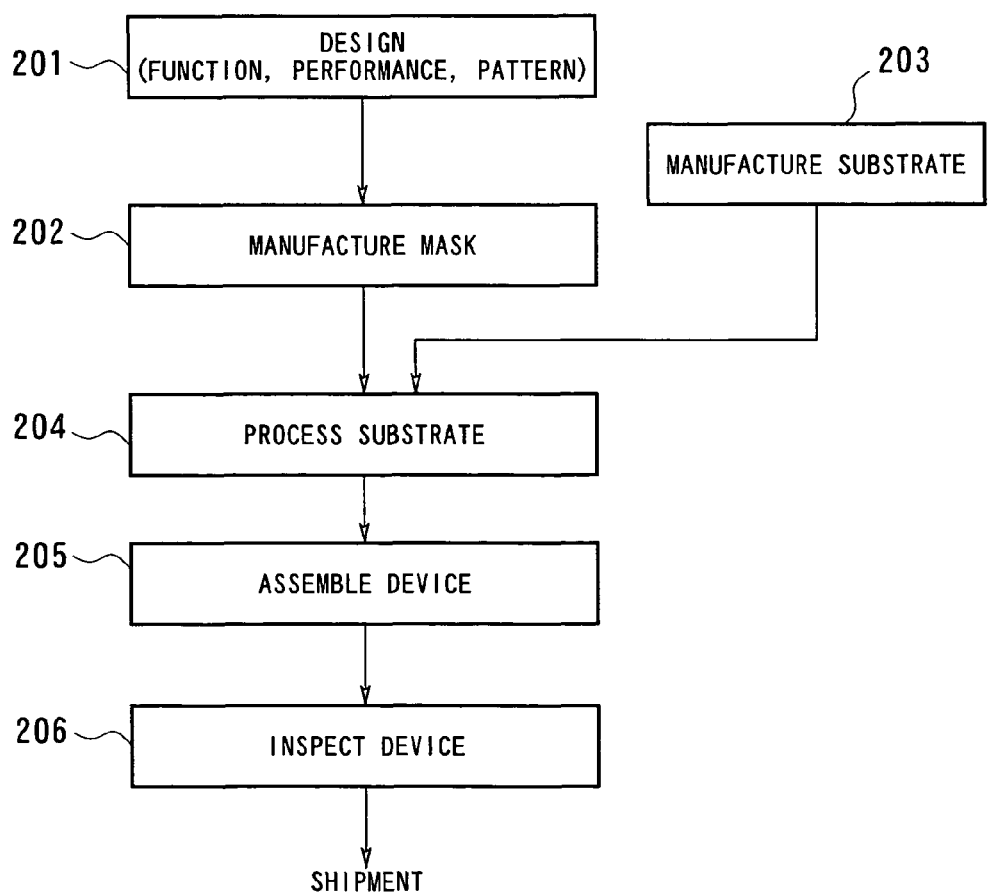
FIG. 13 is a flowchart showing an example of a semiconductor device manufacturing process.

As shown in FIG. 13, microdevices such as semiconductor devices are manufactured by going through; a step 201 that performs microdevice function and performance design, a step 202 that creates the mask (reticle) based on this design step, a step 203 that manufactures the substrate that is the device base material, a substrate processing step 204 that exposes the pattern on the mask onto a substrate by means of the exposure apparatus EX of the aforementioned embodiments, a process for developing the exposed substrate, and a process for heating (curing) and etching the developed substrate, a device assembly step (including a dicing process, a bonding process and a packaging process) 205, an inspection step 206, and so on.

The invention claimed is:

1. An exposure apparatus that exposes a substrate by irradiating exposure light onto a front surface of the substrate via a projection optical system and a liquid, comprising:
a substrate holder configured to hold a back surface of the substrate;
a lifting member configured to lift the substrate with respect to the substrate holder; and
a vacuum recovery mechanism that recovers a liquid adhered to the back surface of the substrate and a liquid adhered to the substrate holder while the lifting member lifts the substrate from the substrate holder while holding the back surface of the substrate.

2. The exposure apparatus according to claim 1, wherein the recovery mechanism is also capable of recovering a liquid adhered to a side surface of the substrate substantially simultaneously.

3. The exposure apparatus according to claim 1, wherein the substrate holder includes:
a peripheral wall portion that has an upper surface facing the back surface of the substrate; and
a supporting portion that is located on an inside of the peripheral wall potion, the substrate holder supporting the substrate with the supporting portion by negatively pressurizing a space surrounded by the peripheral wall portion, and
the recovery mechanism includes:
a collection inlet provided on the inside of the peripheral wall portion; and
a vacuum system that connects to the collection inlet, the recovery mechanism suction recovering the liquid, with the upper surface of the peripheral wall portion and the back surface of the substrate being spaced at a first distance.

4. The exposure apparatus according to claim 1, wherein the recovery mechanism includes a channel connected to the collection inlet, and wherein a surface of the channel includes a heat-insulating layer.

5. An exposure apparatus that exposes a substrate by irradiating exposure light onto a front surface of the substrate via a projection optical system and a liquid, comprising:
a substrate holder which has a peripheral wall portion and a supporting portion located on an inside of the peripheral wall portion, the substrate holder configured to support the substrate with the supporting portion in a first configuration by negatively pressurizing a space surrounded by the peripheral wall portion; and
a recovery mechanism which has a collection inlet provided on the inside of the peripheral wall portion and a vacuum system connected to the collection inlet, wherein
a liquid penetrated from an outer periphery of the substrate is sucked and recovered while an upper surface of the supporting portion and a back surface of the substrate are spaced apart a first distance in a second configuration,
wherein the recovery mechanism includes a channel connected to the collection inlet, and wherein a surface of the channel includes a heat-insulating layer.

6. The exposure apparatus according to claim 5, wherein the first distance is determined in accordance with physical properties of the liquid, affinity of each of the upper surface of the peripheral wall portion and the back surface of the substrate for the liquid, and a suction force of the vacuum system.

7. The exposure apparatus according to claim 5, wherein the upper surface of the peripheral wall portion is liquid-repellent.

8. The exposure apparatus according to claim 5, further comprising:
a gap adjustment mechanism that adjusts a distance between the upper surface of the peripheral wall portion and the back surface of the substrate.

9. The exposure apparatus according to claim 8, wherein the gap adjustment mechanism holds the back surface of the substrate, and includes raising/lowering members that raise and lower the substrate with respect to the substrate holder.

10. The exposure apparatus according to claim 8, further comprising
a measurement apparatus that measures a distance between the upper surface of the peripheral wall portion and the back surface of the substrate, wherein
the gap adjustment mechanism adjusts the distance based on a measurement result from the measurement apparatus.

11. The exposure apparatus according to claim 5, wherein the collection inlet is provided in the vicinity of the inside of the peripheral wall portion.

12. The exposure apparatus according claim 5, wherein the substrate has a cut portion,
a concave portion in accordance with the cut portion is provided in the peripheral wall portion in the vicinity of the cut portion, and
the collection inlet is provided in the vicinity of the concave portion.

13. The exposure apparatus according to claim 5, wherein the substrate holder has, on the inside of the peripheral wall portion, a bottom portion that faces the back surface supported by the supporting portions at a predetermined distance apart,
the collection inlet is provided in a predetermined position on the bottom portion, and
the bottom portion bas an inclined region that inclines downward toward the collection inlet.

14. The exposure apparatus according to claim 5, wherein, the substrate holder has, on the inside of the peripheral wall portion, a bottom portion that faces the back surface of the substrate supported by the supporting portions at a predetermined distance apart, and
a connection portion between the peripheral wall portion and the bottom portion is formed in an arc shape in a sectional view.

15. The exposure apparatus according to claim 5, wherein a suction port for negatively pressuring the space when the substrate is to be supported by the supporting portion is used also as the collection inlet of the recovery mechanism.

16. The exposure apparatus according to claim 5, wherein the substrate holder has a suction port that is provided on the inside of the peripheral wall portion and that is connected to a vacuum system, and
the vacuum system connected to the suction port and the vacuum system connected to the collection inlet are independent of each other.

17. The exposure apparatus according to claim 5, wherein the recovery mechanism recovers a liquid after completion of exposure of the substrate.

18. The exposure apparatus according to claim 5, farther comprising:
 a detection device that detects whether or not a liquid is adhered to at least one of the back surface of the substrate anal the substrate holder; and
 a controller that controls an operation of the recovery mechanism based on a detection result from the detection apparatus.

19. The exposure apparatus according to claim 3 or 5, wherein
 a distance between the upper surface of the peripheral wall portion and the back surface of the substrate when the substrate is supported with the supporting portion by negatively pressurizing the space surrounded by the peripheral wall portion is defined a second distance, the second distance being shorter than the first distance.

20. The exposure apparatus according to claim 19, wherein the second distance is greater than or equal to zero.

21. The exposure apparatus according to claim 1 or 5, wherein
 the recovery mechanism can also recover foreign matter adhered to the substrate or the substrate holder.

22. A device manufacturing method, comprising:
 exposing a substrate by irradiating exposure light onto a front surface of the substrate via a projection optical system and a liquid using the exposure apparatus according to claim 1 or 5.

23. An exposure apparatus that exposes a substrate by irradiating exposure light onto a front surface of the substrate via a projection optical system and a liquid, comprising:
 a substrate holder having a peripheral wall portion and a supporting portion, a diameter of the supporting portion being shorter in length than a diameter of the peripheral wall portion, the substrate holder supporting the substrate with the supporting portion in a first configuration by negatively pressurizing a space surrounded by the peripheral wall portion, an upper surface of the peripheral wall portion and a back surface of the substrate at least partially overlapping in a direction of the irradiating exposure light; and
 a fluid recovery mechanism having a collection inlet provided along the peripheral wall portion and a vacuum system connected to the collection inlet, wherein
 a liquid penetrated from an outer periphery of the substrate is recovered by the fluid recovery mechanism when the back surface of the substrate is spaced apart from an upper surface of the supporting section in a second configuration,
 wherein the fluid recovery mechanism includes a channel connected to the collection inlet, and wherein a surface of the channel includes a heat-insulating layer.

24. The exposure apparatus according to claim 23, wherein the fluid recovery mechanism is also configured to recover a liquid adhered to a side surface of the substrate.

25. The exposure apparatus according to claim 23, wherein a distance between the upper surface of the peripheral wall portion and the back surface of the substrate in the first configuration is shorter than a distance between the upper surface of the peripheral wall portion and the back surface of the substrate in the second configuration.

26. The exposure apparatus according to claim 25, wherein the distance in the second configuration is determined in accordance with any one of physical properties of the liquid, affinity of each of the upper surface of the peripheral wall portion and the back surface of the substrate for the liquid, and a suction force of the vacuum system.

27. An exposure apparatus that exposes a substrate by irradiating exposure light onto a substrate via a projection optical system and liquid, comprising:
 a substrate holder which has a peripheral wall portion and a supporting portion located on an inside of the peripheral wall portion, the substrate holder configured to support a back surface of the substrate with the supporting portion;
 a lifting member configured to lift the substrate with respect to the substrate holder; and
 a recovery mechanism that recovers liquid adhered to the back surface of the substrate and liquid adhered to the substrate holder when the upper surface of the peripheral wall portion and the back surface of the substrate are spaced at a first distance,
 wherein a distance between the upper surface of the peripheral portion and the back surface of the substrate when the substrate is supported with the supporting portion by negatively pressurizing the space surrounded by the peripheral wall portion is defined by a second distance, the second distance being shorter than the first distance.

28. The exposure apparatus according to claim 27, wherein the recovery mechanism has a collection inlet connected to a vacuum system, and wherein the liquid adhered to the back surface of the substrate and the liquid adhered to the substrate holder are recovered via the collection inlet.

29. The exposure apparatus according to claim 28, wherein the recovery mechanism includes a channel connected to the collection inlet, and wherein a surface of the channel includes a heat-insulating layer.

30. The exposure apparatus according to claim 28, wherein the first distance is determined in accordance with a suction force of the vacuum system.

31. The exposure apparatus according to claim 28, wherein the collection inlet is provided in the vicinity of the peripheral wall portion.

32. The exposure apparatus according to claim 27, wherein the second distance is greater than or equal to zero.

33. The exposure apparatus according to claim 27, wherein the recovery mechanism is configured to recover liquid adhered to a side surface of the substrate.

34. The exposure apparatus according to claim 27, wherein the upper surface of the peripheral wall portion is liquid-repellent.

35. The exposure apparatus according to claim 34, wherein the upper surface of the peripheral wall portion includes polytetrafluoroethylene or an acrylic resin material.

36. The exposure apparatus according to claim 27, wherein the first distance is determined in accordance with physical properties of the liquid.

37. The exposure apparatus according to claim 27, wherein the first distance is determined in accordance with affinity of each of the upper surface of the peripheral wall portion and the back surface of the substrate for the liquid.

38. An exposure apparatus that exposes a substrate by irradiating exposure light onto a substrate via a projection optical system and a liquid immersion region formed under the projection optical system, comprising:
 a stage which has a peripheral wall portion and a supporting portion located on an inside of the peripheral wall portion, the stage configured to support the substrate with the supporting portion;
 a lifting member configured to lift the substrate with respect to the stage; and a recovery device that recovers liquid leaked from the liquid immersion region when an upper surface of the peripheral wall portion and a back surface of the substrate lifted by the lifting member are spaced at a first distance, wherein a distance between the upper surface of the peripheral portion and the back surface of the substrate when the substrate is supported with the supporting portion by negatively pressurizing the space surrounded by the peripheral wall portion is defined a second distance, the second distance being shorter than the first distance.

39. The exposure apparatus according to claim 38, wherein the recovery device includes a collection inlet connected to a vacuum system, and wherein a liquid adhered to the back surface of the substrate and a liquid adhered to the stage are recovered via the collection inlet.

40. The exposure apparatus according to claim 38, wherein the recovery device includes a collection inlet through which the liquid is recovered, and a channel connected to the collection inlet, and wherein a surface of the channel includes a heat-insulating layer.

41. The exposure apparatus according to claim 40, wherein a liquid-repellent layer is formed on the heat-insulating layer.

42. The exposure apparatus according to claim 40, wherein the heat-insulating layer includes a fluorine-based resin material.

43. The exposure apparatus according to claim 38, wherein the recovery device includes a collection inlet through which the liquid is recovered, and a channel connected to the collection inlet, and wherein a surface of the channel includes a liquid-repellent layer.

44. The exposure apparatus according to claim 43, wherein the liquid-repellent layer includes a fluorine-based resin material.

45. The exposure apparatus according to claim 38, wherein the second distance includes zero.

* * * * *

UNITED STATES PATENT AND TRADEMARK OFFICE
CERTIFICATE OF CORRECTION

PATENT NO. : 8,368,870 B2  
APPLICATION NO. : 11/629987  
DATED : February 5, 2013  
INVENTOR(S) : Makoto Shibuta Page 1 of 1

It is certified that error appears in the above-identified patent and that said Letters Patent is hereby corrected as shown below:

In the Claims:
Column 34, Line 32, In Claim 12, after "according" insert -- to --.
Column 34, Line 46, In Claim 13, delete "bas" and insert -- has --, therefor.
Column 35, Line 4, In Claim 18, delete "farther" and insert -- further --, therefor.
Column 35, Line 8, In Claim 18, delete "anal" and insert -- and --, therefor.

Signed and Sealed this
Eleventh Day of June, 2013

Teresa Stanek Rea
*Acting Director of the United States Patent and Trademark Office*